United States Patent
Nakano et al.

(10) Patent No.: US 9,865,831 B2
(45) Date of Patent: Jan. 9, 2018

(54) POLYMER, ORGANIC THIN-FILM SOLAR CELL USING THE SAME, AND ELECTRONIC PRODUCT COMPRISING THE CELL

(71) Applicant: Kabushiki Kaisha Toshiba, Minato-ku (JP)

(72) Inventors: Yoshihiko Nakano, Yokohama (JP); Takeshi Gotanda, Yokohama (JP); Rumiko Hayase, Yokohama (JP); Yuki Kudo, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 322 days.

(21) Appl. No.: 14/701,263

(22) Filed: Apr. 30, 2015

(65) Prior Publication Data
US 2015/0236288 A1    Aug. 20, 2015

Related U.S. Application Data

(63) Continuation of application No. PCT/JP2013/079293, filed on Oct. 29, 2013.

(30) Foreign Application Priority Data

Nov. 1, 2012    (JP) .................................. 2012-241875

(51) Int. Cl.
*H01L 31/00* (2006.01)
*C08G 75/00* (2006.01)
(Continued)

(52) U.S. Cl.
CPC ............ *H01L 51/426* (2013.01); *C08G 75/10* (2013.01)

(58) Field of Classification Search
CPC .............................. C08G 75/10; H01L 51/426
(Continued)

(56) References Cited

U.S. PATENT DOCUMENTS

| 8,372,945 B2 | 2/2013 | Hou et al. |
| 8,436,134 B2 | 5/2013 | Yu et al. |
| 2013/0043434 A1 | 2/2013 | Tierney et al. |

FOREIGN PATENT DOCUMENTS

| CN | 102149750 A | 8/2011 |
| CN | 102329411 A | 1/2012 |

(Continued)

OTHER PUBLICATIONS

Combined Chinese Office Action and Search Report issued Jan. 8, 2016 in Patent Application No. 201380056977.9 (with English language translation).

(Continued)

*Primary Examiner* — William Cheung
(74) *Attorney, Agent, or Firm* — Oblon, McClelland, Maier & Neustadt, L.L.P.

(57) ABSTRACT

To provide a polymer excellent enough in photoelectric conversion efficiency and in light resistance to be suitable for solar cells, also to provide a solar cell using the polymer, and further to provide an electronic product comprising the cell. Embodiments of the present disclosure provide a polymer comprising a repeating unit of the following formula (M1).

(Continued)

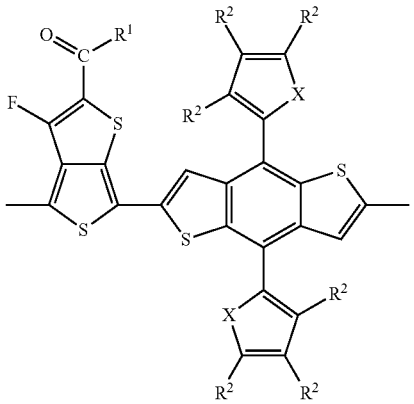

(M1)

In the formula, $R^1$ is a substituent group selected from the group 15 consisting of alkyl groups, and alkoxy groups; each $R^2$ is independently a substituent group selected from the group consisting of hydrogen, halogen, alkyl groups, alkoxy groups, and aryl groups; and each X is independently an atom selected from the group consisting of O, S and Se. The embodiments 20 also provide a solar cell having an active layer containing the above polymer and further an electronic product comprising that cell.

16 Claims, 2 Drawing Sheets

(51) Int. Cl.
  *H01L 51/42* (2006.01)
  *C08G 75/10* (2006.01)
(58) Field of Classification Search
  USPC .......................................... 136/263; 528/226
  See application file for complete search history.

(56) References Cited

FOREIGN PATENT DOCUMENTS

| CN | 102482421 A | 5/2012 |
|---|---|---|
| CN | 102532492 A | 7/2012 |
| CN | 103804649 A | 5/2014 |
| CN | 104448247 A | 3/2015 |
| TW | 201141902 A1 | 12/2011 |
| WO | 2008/066933 A2 | 6/2008 |
| WO | 2010/008672 A1 | 1/2010 |
| WO | 2011/011545 A1 | 1/2011 |
| WO | WO 2011/011545 | * 1/2011 |
| WO | WO 2011/085004 A2 | 7/2011 |
| WO | WO 2011/085004 A3 | 7/2011 |
| WO | WO 2011/131280 A1 | 10/2011 |
| WO | WO 2012/132735 A1 | 10/2012 |
| WO | 2013/116643 A1 | 8/2013 |

OTHER PUBLICATIONS

Hae Jung Son, et al., "Synthesis of Fluorinated Polythienothiophene-co-benzodithiophenes and Effect of Fluorination on the Photovoltaic Properties", Journal of the American Chemical Society, vol. 133, Jan. 25, 2011, pp. 1885-1894.
International Search Report dated Dec. 24, 2013 in PCT/JP2013/079293 filed Oct. 29, 2013.
Y. Liang, et al., "For the Bright Future-Bulk Heterojunction Polymer Solar Cells with Power Conversion Efficiency of 7.4%", Adv. Mater., vol. 22, pp. E135-E138 (2010).
Y. Liang, et al., "Highly Efficient Solar Cell Polymers Developed via Fine-Tuning of Structural and Electronic Properties", J. Am. Chem. Soc., vol. 131, pp. 7792-7799 (2009).
R. Duan, et al., "Application of Two-Dimensional Conjugated Benzo[1,2-b:4,5-b']dithiophene in Quinozaline-Based Photovoltaic Polymers", Macromolecules, vol. 45, pp. 3032-3038 (2012).
L. Huo, et al. "Replacing Alkoxy Groups with Alkylthienyl Groups; A Feasible Approach to Improve the Properties of Photovoltaic Polymers", Angew. Chem. Int. Ed., vol. 50, pp. 9697-9702 (2011).
M. Jorgensen, et al., "Stability of Polymer Solar Cells", Adv. Mater, vol. 24, pp. 580-612 (2012).
A.D. Schlüter, The Tenth Anniversary of Suzuki Polycondensation (SPC), Journal of Polymer Science: Part A: Polymer Chemistry, vol. 39, pp. 1533-1556 (2001).
C.J. Brinker, et al., Sol-Gel Science, The Physics and Chemistry of Sol-Gel Processing, Academic Press, Inc., San Diego, CA, pp. 272-301 and 734-742 (1990).
D. J. Zwanenburg, et al., The Synthesis of 4,6-Dihydrothieno[3,4-b]thiophene[1], J. Org. Chem., vol. 31, pp. 3363-3365 (1966).
H-Y. Chen, et al., "Polymer solar cells with enhanced open-circuit voltage and efficiency", Nature Photonics, vol. 3, pp. 649-653 (2009).
Combined Taiwanese Office Action and Search Report dated May 15, 2015 in Patent Application No. 102139623 (with English language translation).
Extended European Search Report dated Jul. 14, 2016 in Patent Application No. 13850328.9.
Letian Dou, et al., "Tandem polymer solar cells featuring a spectrally matched low-bandgap polymer." Nature Photonics, vol. 6, No. 3, XP55195630, Feb. 12, 2012, pp. 180-185.
Office Action dated Nov. 4, 2015 in Japanese Patent Application No. 2014-544526 (with English language translation).
Korean Office Action dated Mar. 12, 2016 in Patent Application No. 10-2015-7010864 (with unedited computer generated English translation).

* cited by examiner

POLYMER, ORGANIC THIN-FILM SOLAR CELL USING THE SAME, AND ELECTRONIC PRODUCT COMPRISING THE CELL

This application is a continued application of PCT Application No. PCT/JP2013/079293, filed on Oct. 29, 2013, which claims priority to Japan Patent Application No. 2012-241875, filed in Japan on Nov. 1, 2012, all of which are hereby expressly incorporated by reference into the present application.

TECHNICAL FIELD

The present disclosure relates to a polymer, an organic thin-film solar cell using the polymer, and an electronic product comprising the cell.

BACKGROUND ART

It is hoped that organic semiconductors will be used for application to solar cell devices, such as, organic thin-film solar cells, light-emitting devices, and optical sensors. Specifically, for example, if polymers can be used as organic semiconductor materials, it becomes possible to form an active layer by use of a low-cost coating method. Meanwhile, in view of the energy problem and the reduction of $CO_2$ emission, there is rapidly increasing demand for solar cells, which are regarded as one of the clean energy sources with low environmental load. However, although silicon-type solar cells are popularly used now, their efficiencies are about 15% and their production costs are difficult to reduce. Further, although CdTe solar cells are known as low-cost solar cells, they use Cd, which is a toxic element, and hence it is feared that they may cause environmental problems. Under these circumstances, there is increasing hope for developing organic thin-film solar cells, which are harmless next-generation solar cells of low cost and of high energy-conversion efficiency.

However, there are two large problems in realizing organic thin-film solar cells. One is to improve the power generation efficiency. In view of that, researches have been made on various polymeric organic semiconductors usable for organic thin-film solar cells. As a result, it has been found that some polymers enable organic thin-film solar cells to have as high a conversion efficiency as 7% or more, which is a value at the top level in the world. Known examples of them include: poly{4,8-bis(2-ethylhexyloxy)benzo-[1,2-b; 4,5-b']-dithiophene-2,6-diyl-alt-4-(2-ethylhexyloxycarbonyl)-5-fluoro-thieno[3,4-b]thiophene-2,6-diyl} (hereinafter, referred to as "PTB-7"); and a polymer (referred to as "PBDTTT-CF") derived from PTB-7 by replacing the ester substituent group (i.e., 2-ethylhexyloxycarbonyl) at the 4-position of the thieno[3,4-b]-thiophene ring with a strong electron-withdrawing carbonyl group (i.e., n-heptylcarbonyl) so as to improve the open circuit voltage (Voc). However, those polymers are obtained by very complicated synthetic routes in which monomers are synthesized through many steps.

In order to reduce the steps for synthesis, development has been made to provide poly{4,8-bis(2-ethylhexyloxy)benzo[1,2-b;4,5-b']-dithiophene-2,6-diyl-alt-4-(2-heptylcarbonyl)}thieno-[3,4-b]thiophene-2,6-diyl} (hereinafter, referred to as "PDBTTT-C"), in which fluorine at the 5-position of the thieno[3,4-b]thiophene in PBDTTT-CF is replaced with hydrogen. However, that polymer has a problem of slightly lowering the conversion efficiency. It is hence also known that PDBTTT-C is modified so as to improve the conversion efficiency by replacing 2-ethylhexyloxy groups at the 4- and 8-positions of the benzo-[1,2-b;4,5-b']-dithiophene ring with 5-(2-ethylhexyl)-thienyl groups.

Those polymers indicate that the conversion efficiency of solar cell greatly depends on side chains of the polymers. Accordingly, for the purpose of improving the performance of solar cells, it is necessary to optimize not only the polymer skeleton but also the side chain and therefore to make many trials and errors.

The other problem in developing organic thin-film solar cells is to expand the lifetime, and it is known that photo-stable active materials (i.e., donor and acceptor) are indispensable for expanding the lifetime of solar cell.

PRIOR ART DOCUMENTS

Patent Documents

[Patent document 1] International Patent Publication No. 2010/008672
[Patent document 2] International Patent Publication No. 2011/011545
[Patent document 3] International Patent Publication No. 2008/066933

Non-Patent Documents

[Non-patent document 1] Angew. Chem. Int. Ed. 2011, 50, 9697
[Non-patent document 2] Adv. Mater. 2012, 24, 580
[Non-patent document 3] Journal of Polymer Science: Part A: Polymer Chemistry, 2001, vol. 39, pp. 1533-1
[Non-patent document 4] Sol-Gel Science, written by C. J. Brinker, G. W. Scherer, Academic Press (1990)
[Non-patent document 5] J. Am. Chem. Soc. 2009 Vol. 131, No. 22, 7792-7799
[Non-patent document 6] D. J. Zwanenburg et al., J. Org. Chem., 1966, Vol. 31, 3363
[Non-patent document 7] Nature Photonics 2009, Vol. 3, 64

DISCLOSURE OF INVENTION

Problem to be Solved by the Invention

It is an object of the present disclosure to provide a polymer for realizing both high conversion efficiency and long lifetime of organic thin-film solar cells.

An embodiment of the present disclosure resides in a polymer comprising a repeating unit represented by the following formula (M1):

[Formula 1]

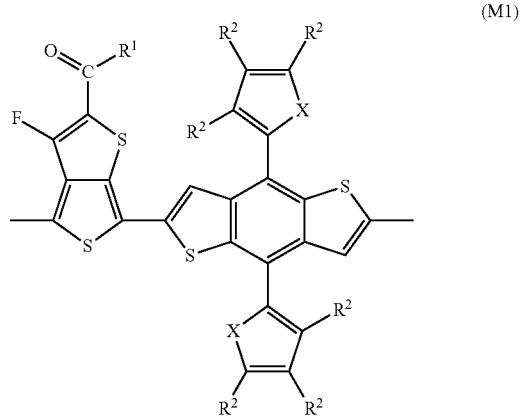

(M1)

in which
R¹ is a substituent group selected from the group consisting of unsubstituted alkyl groups, substituted alkyl groups, unsubstituted alkoxy groups, substituted alkoxy groups, unsubstituted aryl groups and substituted aryl groups;
each R² is independently a substituent group selected from the group consisting of hydrogen, halogen, unsubstituted alkyl groups, substituted alkyl groups, unsubstituted alkoxy groups, substituted alkoxy groups, unsubstituted aryl groups, and substituted aryl groups;
and
each X is independently an atom selected from the group consisting of O, S and Se,
wherein said polymer has a weight average molecular weight of 3000 to 1000000.

MEANS FOR SOLVING PROBLEM

Polymer

Figure 1:
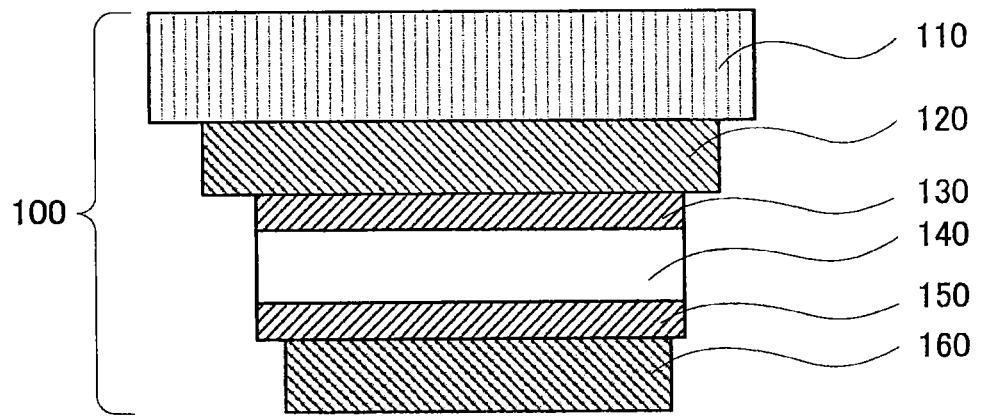
FIG. 1 shows a schematic sectional view of a solar cell device according to an embodiment of the present disclosure.

The polymer according to an embodiment of the present disclosure is characterized by comprising a particular repeating unit. Specifically, the polymer according to an embodiment of the present disclosure comprises a repeating unit represented by the following formula (M1):

[Formula 2]

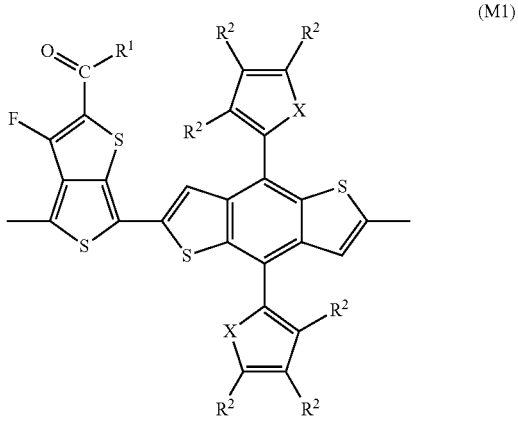

(M1)

In the formula, R¹ is a substituent group selected from the group consisting of unsubstituted alkyl groups, substituted alkyl groups, unsubstituted alkoxy groups, substituted alkoxy groups, unsubstituted aryl groups and substituted aryl groups;
each R² is independently a substituent group selected from the group consisting of hydrogen, halogen, unsubstituted alkyl groups, substituted alkyl groups, unsubstituted alkoxy groups, substituted alkoxy groups, unsubstituted aryl groups, and substituted aryl groups; and each X is independently an atom selected from the group consisting of O, S and Se. Among them, O and S are preferred. That is because the compound can be easily produced if X is S and also because the solar cell comprising the polymer tends to have an improved lifetime if X is O.

There are no particular restrictions on the number of carbon atoms contained in each of R¹ and R². However, if being an alkyl group or an alkoxy group, the substituent group preferably contains 1 to 30 carbon atoms. If being an aryl group, it preferably contains 4 to 20 carbon atoms. The alkyl or alkoxy group may have any of straight-chain, branched-chain and cyclic chain structures. The substituted aryl group may be an aryl ring to which a substituent group connects, or may be a heteroaryl group, in which a hetero atom is contained as a member of the ring. The R² groups may be the same or different from each other. The R² connecting to the carbon atom next to the atom X is preferably not a hydrogen atom.

Examples of the unsubstituted or substituted alkyl groups include: methyl, ethyl, propyl, isopropyl, butyl, pentyl, hexyl, octyl, isooctyl, 2-ethylhexyl, nonyl, decyl, dodecyl, octadecyl, trifluoromethyl, pentafluoroethyl, perfluorohexyl, and perfluorooctyl. Those, however, by no means restrict the alkyl groups.

Examples of the unsubstituted or substituted alkoxy groups include: methoxy, ethoxy, propoxy, butoxy, hexyloxy, octyloxy, and 2-ethylhexyloxy. Those, however, by no means restrict the alkoxy groups.

Examples of the unsubstituted or substituted aryl groups include: phenyl, naphthyl, 4-biphenyl, 2-thienyl, 2-furanyl, 4-tolyl, and 4-octylphenyl. Those, however, by no means restrict the aryl groups.

In order to obtain good solubility of the polymer, at least one of the R¹ and R²s is an unsubstituted or substituted alkyl or alkoxy group having 6 or more carbon atoms. Further, the R¹ is preferably a substituent group selected from the group consisting of unsubstituted alkyl groups, substituted alkyl groups. unsubstituted aryl groups and substituted aryl groups.

The polymer has a weight average molecular weight of 3000 to 1000000, preferably 10000 to 400000. Here, the "weight average molecular weight" means a polystyrene-reduced weight average molecular weight determined by gel permission chromatography.

The above halogen is selected from the group consisting of F, Cl, Br, and I.

The above polymer comprising the repeating unit (M1) may have a cyclic structure in which only the repeating units (M1) connect to each other to form a ring, but normally have a terminal group R³. The terminal group may be a substituent group described above as an example of the R¹ or R², but is preferably an aryl group having an electron-withdrawing group or an aryl group having an electron-donating group.

Examples of the aryl group having an electron-withdrawing group include: 4-cyanophenyl, 4-trifluoromethylphenyl, 4-nitrophenyl, 4-methoxycarbonylphenyl, and 2-(5-cyano)thienyl. Examples of the aryl group having an electron-donating group include: 4-methoxyphenyl, N,N-dimethylaminophenyl, tolyl, and 2-(5-octyl)thienyl. Those, however, by no means restrict the terminal group R³.

An example of the polymer according to an embodiment of the present disclosure can be also represented by the following formula (1):

[Formula 3]

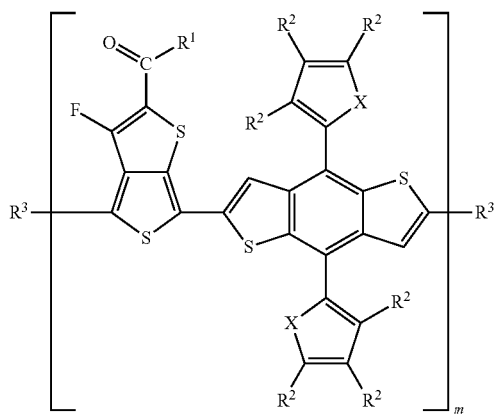

In the formula, R¹ to R³ and X are the same as those described above; and m is a number indicating the polymerization degree. The polymer represented by the formula (1) may comprise two or more kinds of repeating units represented by the formula (M1) having different substituent groups.

Examples of the polymer according to an embodiment of the present disclosure are as follows:

[Formula 4]

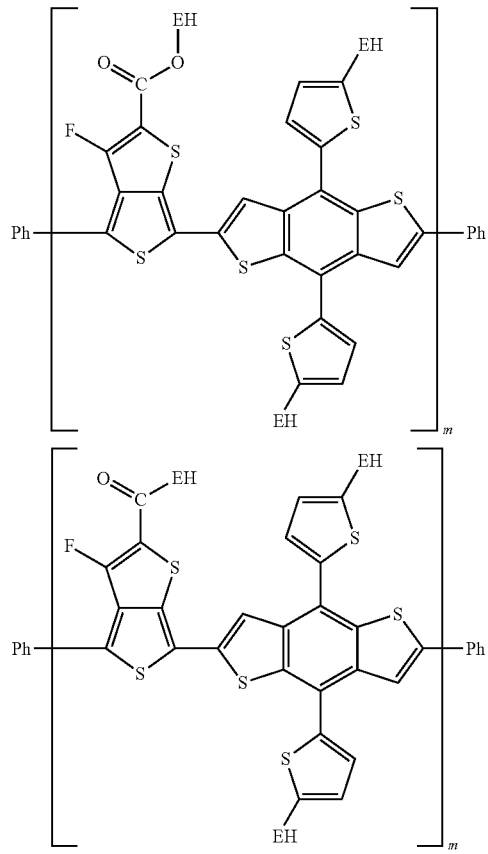

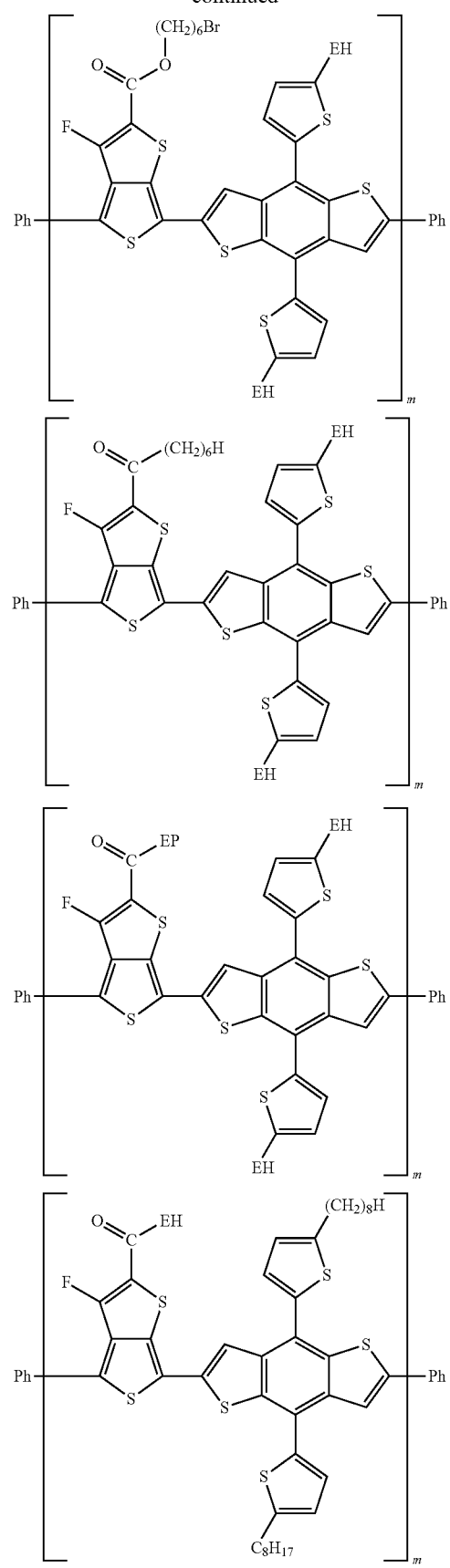

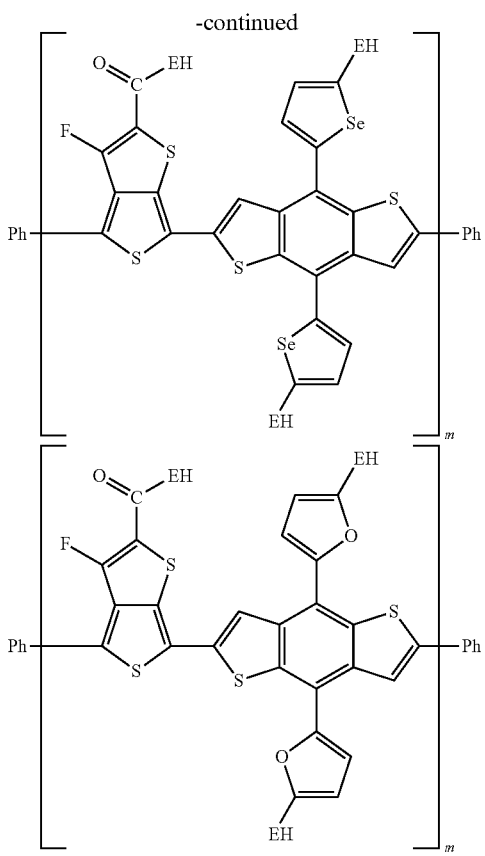

EH: 2-Ethylhexyl
Ph: Phenyl
EP: 1-Ethylpenthyl

The polymer according to an embodiment of the present disclosure preferably comprises a crosslinkable group to improve the durability. There are no particular restrictions on the crosslinkable group as long as it can be crosslinked by light, heat or radical initiators. For example, substituent groups having bromine- or iodine-substituted alkyl or alkoxy groups or otherwise having azo or diazo groups are decomposed by light to cause crosslinking reactions. Further, substituent groups having carbon-carbon double or triple bonds are made to cause photodimerization by light.

Examples of the substituent groups reacted by light include: anthranyl, cinnamoyl, substituent groups having coumarin structures, phenylmaleimide, furfuryl acrylate, and acetylene. Examples of the substituent groups made to cause additional reactions by heat include: benzocyclobutane, cyclopentadienyl, and substituent groups having benzocyclobutane or dulcin structures. The substituent groups having carbon-carbon multiple bonds are capable of reacting as radical initiators, and example of them include acrylic group and methacrylic group. Those can be freely selected according to the aimed use, but they by no means restrict the crosslinkable group.

The polymer can contain a crosslinkable group as any of the substituent groups $R^1$, $R^2$ and the terminal group $R^3$. It is particularly preferred for the substituent group $R^1$ to be a crosslinkable group because the resultant solar cell tends to have an improved lifetime, but it is unnecessary for all the repeating units (M1) to have crosslinkable groups. This means that the polymer may comprise a repeating unit represented by the following formula (M2):

[Formula 5]

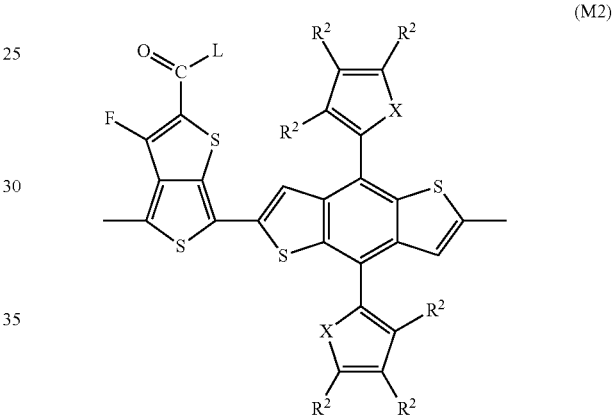

(M2)

In the formula, $R^2$ and X are the same as those described above; and L is a crosslinkable group. The crosslinkable group L is preferably selected from the examples described above.

Accordingly, the polymer according to an embodiment of the present disclosure may be represented by the following formula (2):

[Formula 6]

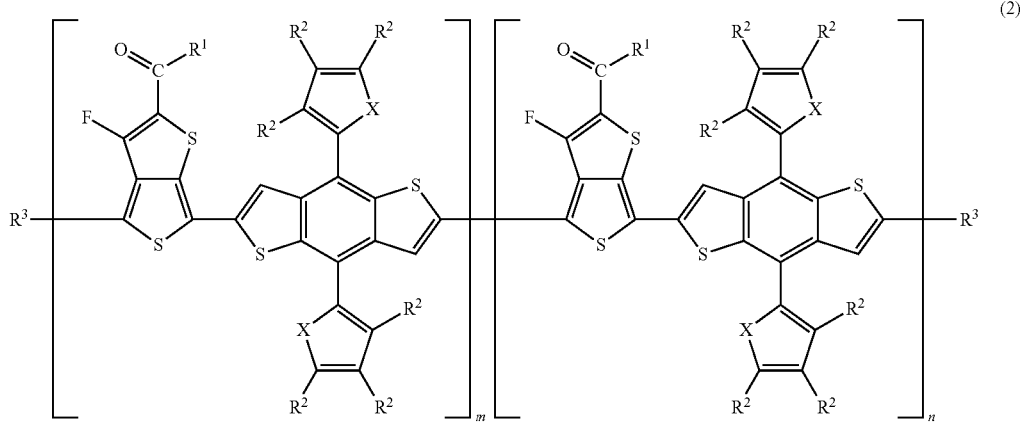

(2)

In the formula, $R^1$ to $R^3$, L and X are the same as those described above; and each of m and n is a number indicating the polymerization degree of each repeating unit. The polymer represented by the formula (2) may be a random copolymer comprising the above repeating units randomly or a block copolymer comprising a block of each repeating unit.

Examples of the above polymer according to an embodiment of the present disclosure are as follows:

[Formula 7]

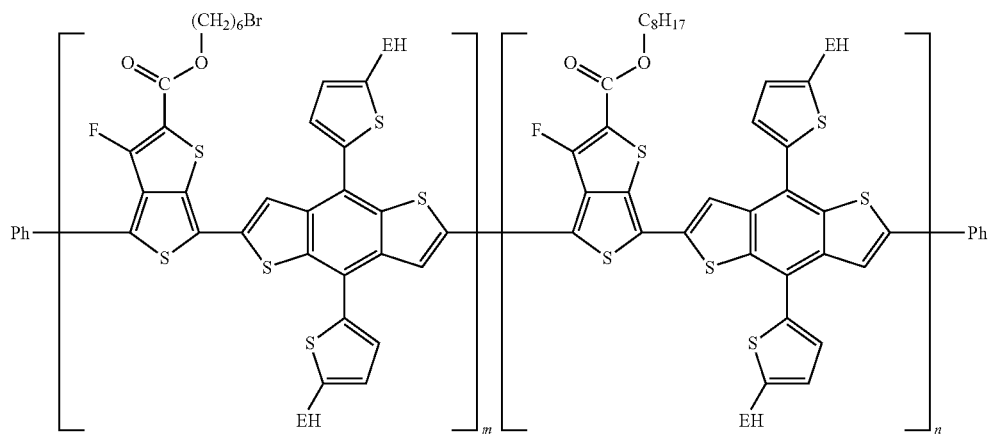

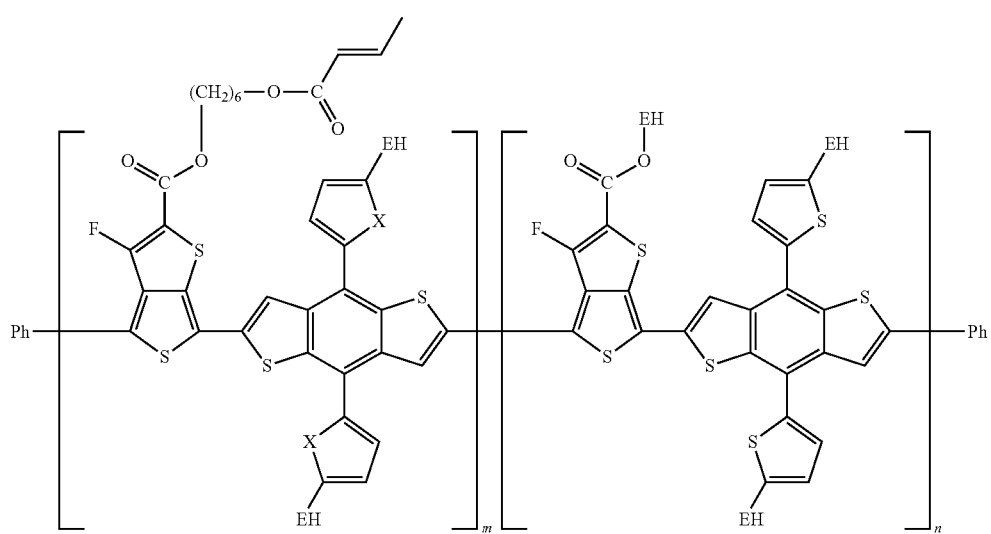

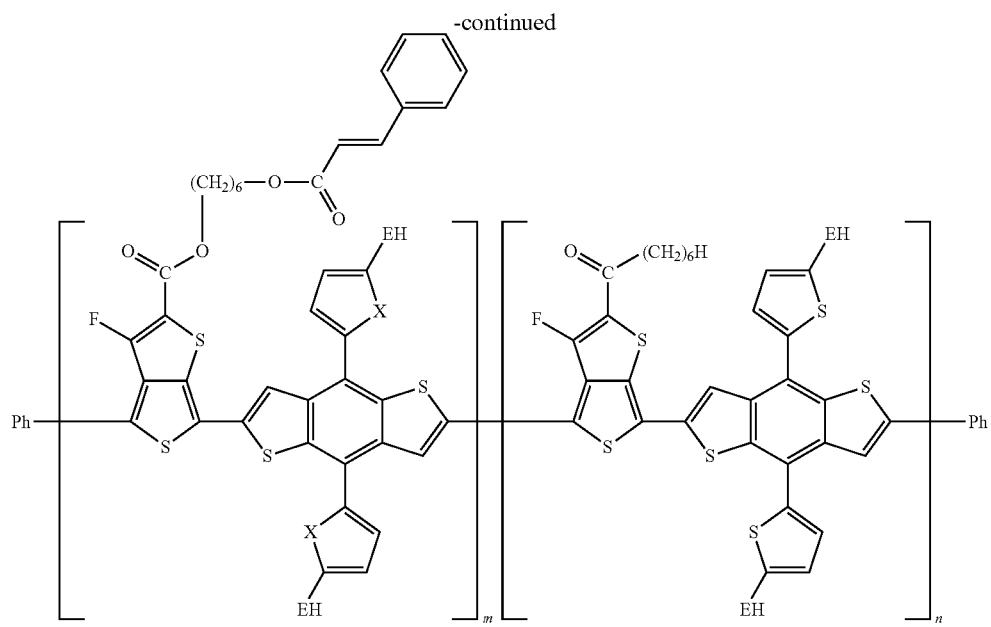
Further, the polymer according to an embodiment of the present disclosure may comprise a repeating unit represented by the following formula (M3):
[Formula 8]
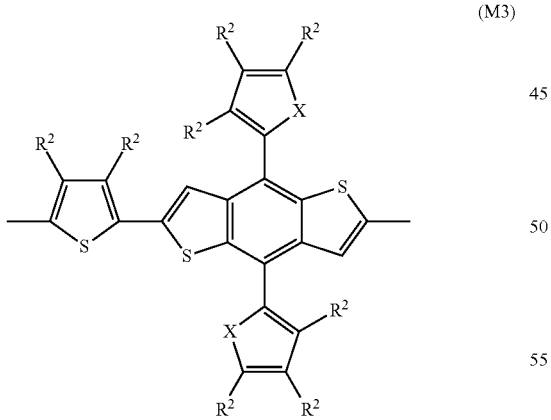
(M3)
In the formula, $R^2$ and X are the same as those described above.
Accordingly, the polymer according to an embodiment of the present disclosure may be represented by the following formula (3):

[Formula 9]

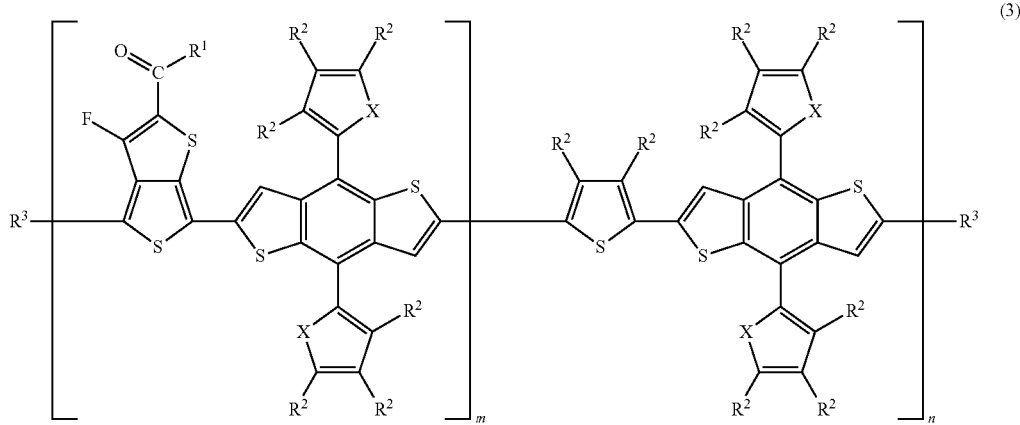

(3)

In the formula, $R^1$ to $R^3$ and X are the same as those described above; and each of m and n is a number indicating the polymerization degree of each repeating unit. The polymer represented by the formula (3) may be a random copolymer comprising the above repeating units randomly or a block copolymer comprising a block of each repeating unit.

Examples of the above polymer according to an embodiment of the present disclosure are as follows:

[Formula 10]

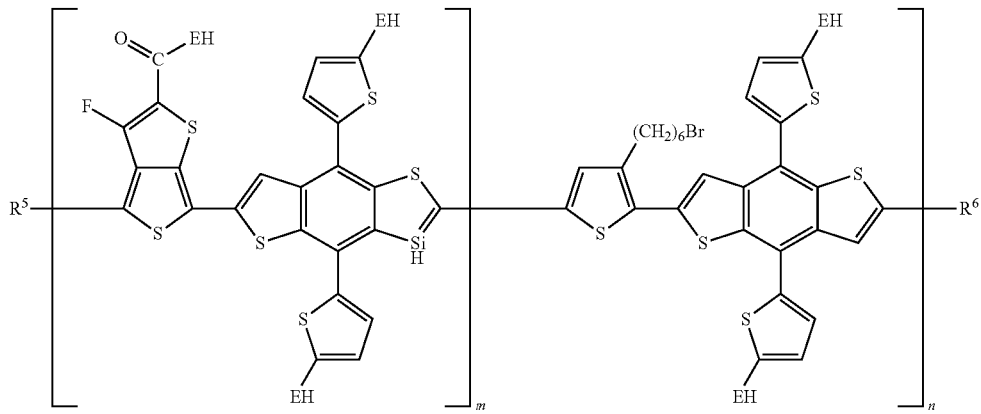

The polymer according to an embodiment of the present disclosure may comprise both of the repeating units (M2) and (M3). Further, other repeating units may be contained unless they impair the effect of the embodiment. In the case where the polymer contains repeating units other than (M1), the amount of the repeating unit (M1) is preferably 50 mol % or more, further preferably 70 mol % or more based on the total molar amount of all the repeating units. The sum of the amounts of the repeating units (M2) and (M3) is preferably 0.1 mol % or more, further preferably 5 mol % or more, based on the total molar amount of all the repeating units.

<Synthesis of Polymer>

The polymer according to an embodiment of the present disclosure can be synthesized according to any method. For example, the polymer can be prepared by the steps of: synthesizing monomers having substituent groups suitable for the aimed polymerization reaction, dissolving the monomers in an organic solvent according to necessity, and then polymerizing them by known aryl coupling reaction with alkalis, catalysts and/or ligands. Examples of the polymerization by aryl coupling reaction include: polymerization by Stille coupling reaction and polymerization by Suzuki coupling reaction.

In the polymerization by Stille coupling reaction, monomers having trialkyltin residues are made to react with monomers having halogen atoms, such as, bromine, iodine and chlorine, by use of a palladium complex as a catalyst and, if necessary, ligands as an additive. Examples of the palladium complex include: palladium-[tetrakis(triphenylphosphine)], [tris(dibenzylideneacetone)]dipalladium, palladium acetate, and bis(triphenylphosphine)palladium chloride.

The polymerization by Stille coupling reaction is disclosed minutely in, for example, Patent document 1. Examples of solvents used in Stille coupling reaction include: toluene, xylene, N,N-dimethylacetamide, N,N-dimethylformamide, and a mixed solvent of two or more of those. Those, however, by no means restrict the solvent. In order to prevent side reactions, the solvent used for Stille coupling reaction is preferably beforehand subjected to deoxygenation treatment.

In the polymerization by Suzuki coupling reaction, monomers having residues of boronic acid or boric ester are made to react with monomers having halogen atoms, such as, bromine, iodine and chlorine, or otherwise with monomers having sulfonate groups, such as, trifluoromethanesulfonate group and p-toluenesulfonate group, in the presence of an inorganic or organic base by use of a palladium or nickel complex as a catalyst and, if necessary, ligands as an additive.

Examples of the inorganic base include: sodium carbonate, potassium carbonate, cesium carbonate, tripotassium phosphate, and potassium fluoride. Examples of the organic base include: tetrabutylammonium fluoride, tetrabutylammonium chloride, tetrabutylammonium bromide, and tetraethylammonium hydroxide. Examples of the palladium complex include: palladium[tetrakis(triphenylphosphine)], [tris(dibenzylideneacetone)]dipalladium, palladium acetate, and bis(triphenylphosphine)palladium dichloride. Examples of the nickel complex include: bis(cyclooctadiene)nickel. Examples of the ligands include: triphenyiphosphine, tri(2-methylphenyl)phosphine, tri(2-methoxyphenyl)phosphine, diphenyiphosphinopropane, tri(cyclohexyl)phosphine, and tri(tert-butyl)phosphine.

The polymerization by Suzuki coupling reaction is disclosed minutely in, for example, Non-patent document 3.

The above polymerization by aryl coupling reaction is normally conducted in a solvent. The solvent is selected according to the adopted polymerization reaction and the solubility of the monomers and polymer. Examples of the solvent include: tetrahydrofuran, toluene, 1,4-dioxane, dimethoxyethane, N,N-dimethylacetamide, N,N-dimethylformamide, a mixed organic solvent of two or more of those, and a two-phase solvent having an organic phase and an aqueous phase. Examples of the solvent preferably used in Suzuki coupling reaction include: tetrahydrofuran, toluene, 1,4-dioxane, dimethoxyethane, N,N-dimethylacetamide, N,N-dimethylformamide, a mixed organic solvent of two or more of those, and a two-phase solvent having an organic phase and an aqueous phase. In order to prevent side reactions, the solvent used for Suzuki coupling reaction is preferably beforehand subjected to deoxygenation treatment.

The lower limit of the reaction temperature in the above aryl coupling reaction is preferably −100° C., more preferably −20° C., particularly preferably 0° C., in view of the reactivity. On the other hand, the upper limit thereof is preferably 200° C., more preferably 150° C., particularly preferably 120° C., in view of the stability of the monomers and polymer.

After the polymerization by aryl coupling reaction, the polymer according to an embodiment of the present disclosure is taken out from the reaction solution by known methods. For example, the reaction solution is poured into a lower alcohol such as methanol, and then the deposited precipitates are collected by filtration and dried to obtain the polymer according to an embodiment of the present disclosure. If being poor in purity, the obtained polymer can be purified, for example, by re-crystallization, by continuous extraction with a Soxhlet extractor, or by gel permission chromatography (GPC).

The polymer according to an embodiment of the present disclosure can be synthesized by use of, for example, Stille coupling reaction. Specifically, for example, a bis(trialkyl) tin compound represented by the formula (4) is polymerized with a dihalogen compound represented by the formula (5).

[Formula 11]

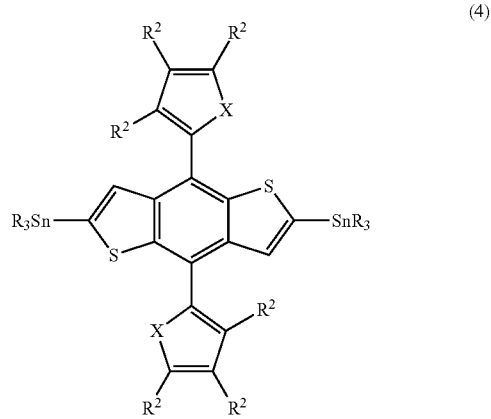

(4)

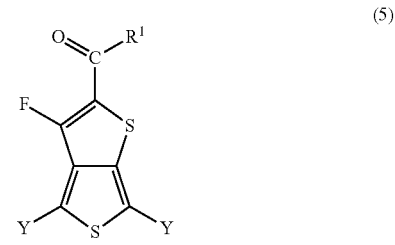

(5)

In the formulas (4) and (5), $R^1$, $R^2$ and X are the same as those described above; $R^3$ is a group selected from the group consisting of unsubstituted alkyl groups and substituted alkyl groups; and Y is a halogen. At least one of the $R^1$ and $R^2$s is preferably a crosslinkable group to improve the durability of the polymer.

Examples of the compound represented by the formula (4) are shown below, but they by no means restrict the compound.

[Formula 12]

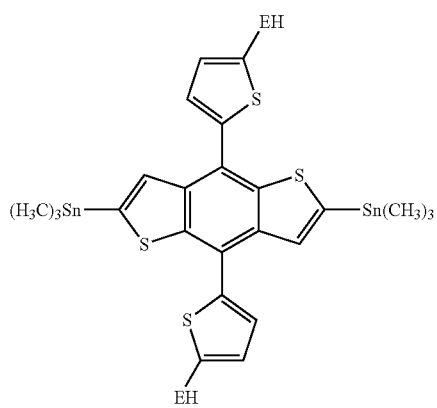

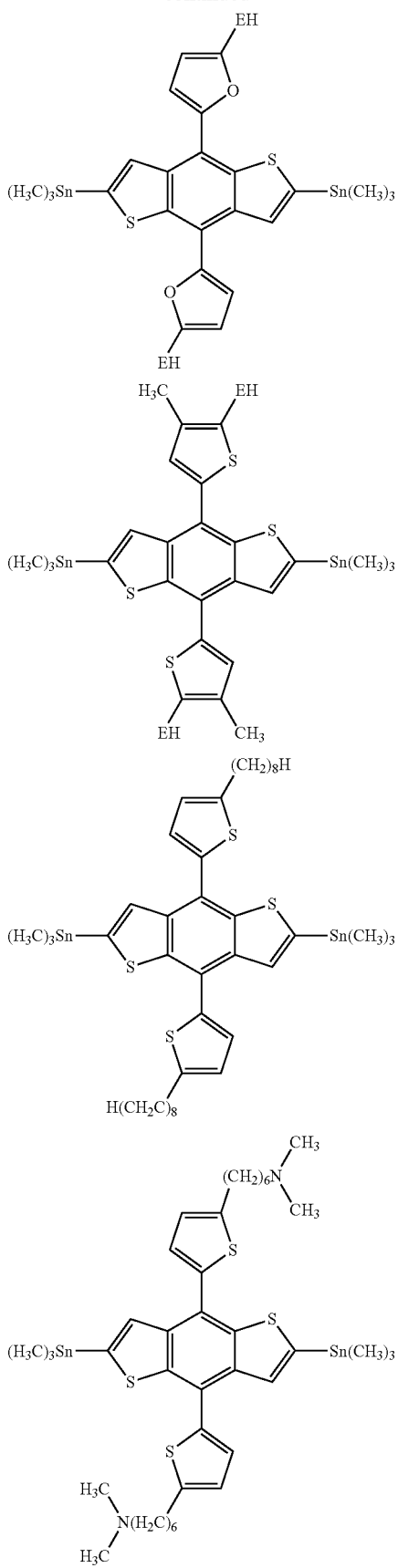
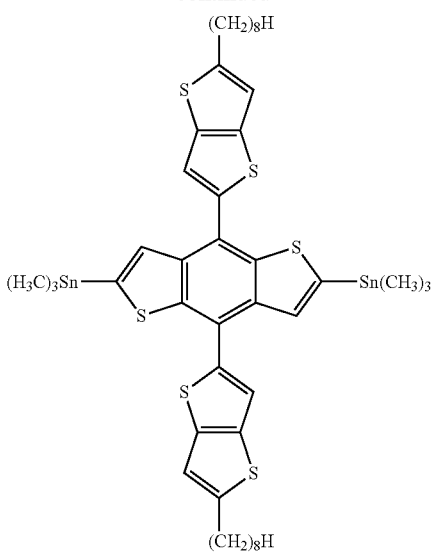
Examples of the compound represented by the formula (5) are shown below, but they by no means restrict the compound.
[Formula 13]
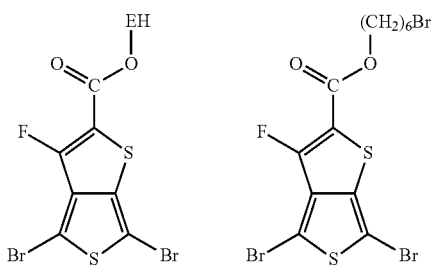
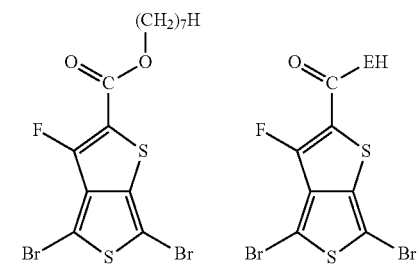
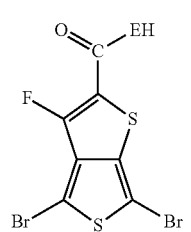

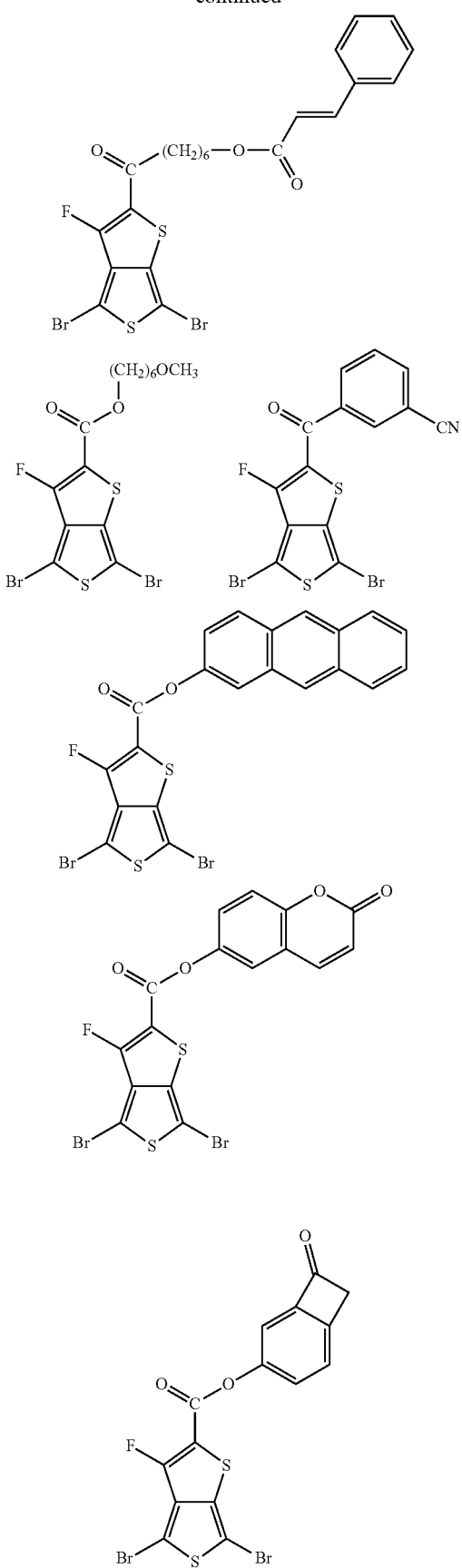

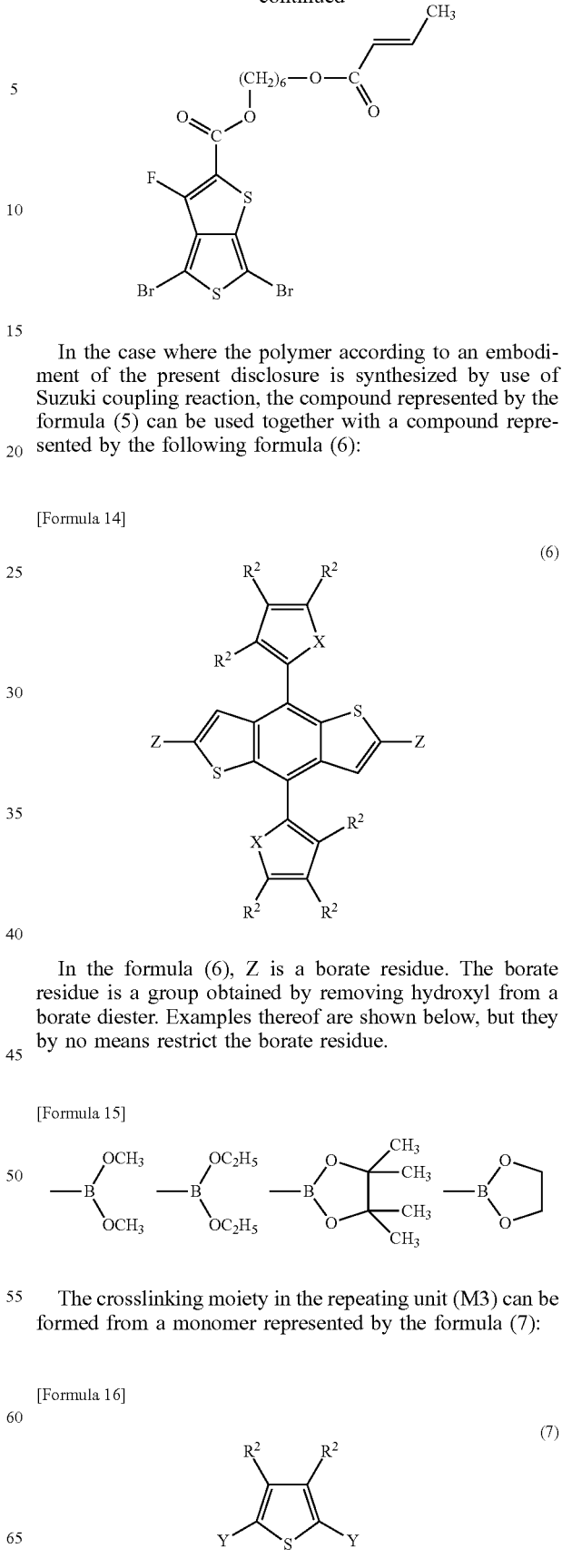

In the case where the polymer according to an embodiment of the present disclosure is synthesized by use of Suzuki coupling reaction, the compound represented by the formula (5) can be used together with a compound represented by the following formula (6):

[Formula 14]

In the formula (6), Z is a borate residue. The borate residue is a group obtained by removing hydroxyl from a borate diester. Examples thereof are shown below, but they by no means restrict the borate residue.

[Formula 15]

The crosslinking moiety in the repeating unit (M3) can be formed from a monomer represented by the formula (7):

[Formula 16]

In the formula (7), $R^2$ and Y are the same as those described above.

Monomers of the formulas (7), (4) and (5) can be polymerized in combination by Stille coupling reaction, to synthesize a polymer represented by the formula (3). Examples of the compound represented by the formula (7) are shown below, but they by no means restrict the compound.

[Formula 17]

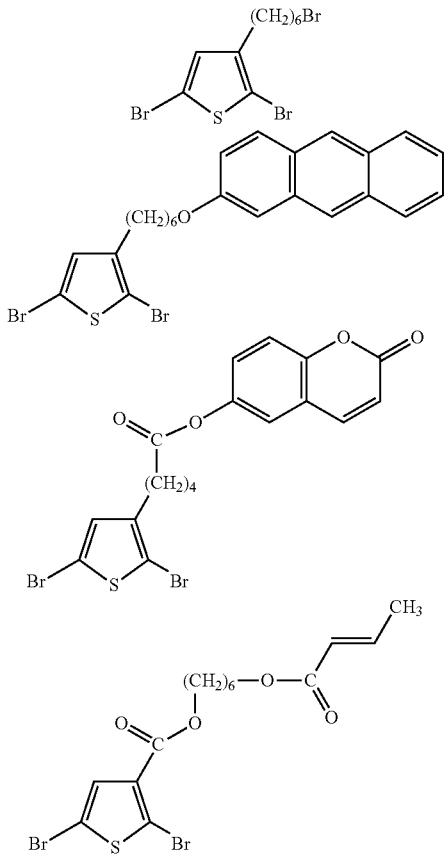

Solar Cell

The solar cell according to an embodiment of the present disclosure contains the above polymer, namely, a polymer comprising the repeating unit (M1). The following is an explanation for constitution of the solar cell according to an embodiment of the present disclosure.

FIG. 1 shows a solar cell device 100 according to an embodiment of the present disclosure. The device of FIG. 1 has a structure generally adopted for an organic thin-film solar cell, but the structure shown in FIG. 1 by no means restricts the solar cell according to the present embodiment. The solar cell device 100 in FIG. 1 comprises electrodes 120, 160 and an active layer 140. Further, as shown in FIG. 1, the solar cell device of the embodiment may comprise at least one of the substrate 110 and buffer layers 130, 150. In FIG. 1, the electrode 120 collects electron holes (accordingly, hereinafter the electrode 120 is often referred to as "anode") while the electrode 160 collects electrons (accordingly, hereinafter the electrode 160 is often referred to as "cathode"). Needless to say, in other embodiments of the present disclosure, the anode 120 and the cathode 160 may exchange their functions with each other. In that case, the buffer layers 130 and 160 may exchange their positions with each other. Each of those parts will be described below.

<Active Layer (140)>

In the solar cell device 100 according to the present embodiment, the active layer 140 contains the above-described polymer and an n-type semiconductor material. In this embodiment of the present disclosure, the above-described polymer serves as a p-type semiconductor material. The active layer 140 may contain two or more kinds of p-type semiconductor materials, and also may contain two or more kinds of n-type semiconductor materials in the present embodiment.

<N-Type Semiconductor Material>

Examples of the n-type semiconductor material (electron-accepting compound) contained in the active layer of the solar cell device according to the present embodiment include: phthalocyanine derivatives, fullerene derivatives, boron-containing polymers, and poly(benzimidazobenzophenanthroline). Those, however, by no means restrict the n-type semiconductor material. Among the above, fullerene derivatives are preferred. Examples of the fullerene derivatives include: 1',1'',4',4''-tetrahydro-di[1,4]methano-naphthaleno[1,2:2',3',56,60:2'',3''][5,6]fullerene-$C_{60}$ (indene-$C_{60}$ bisadducts; IC60BA), [6,6]-Phenyl $C_{61}$ butyric acid methyl ester (PC60BM), [6,6]-Phenyl $C_{71}$ butyric acid methyl ester (PC70BM), dihydronaphtyl-based [60] fullerene bisadducts (NC60BA), and dihydronaphtyl-based [70] fullerene bisadducts (NC70BA). Those, however, by no means restrict the fullerene derivatives.

<Constitution and Structure of Active Layer>

The relation between the LUMO energy levels of the p- and n-type semiconductor materials is important in order that electrons can efficiently migrate from the electron donor (p-type semiconductor) to the electron acceptor (n-type semiconductor). Specifically, it is preferred that the LUMO energy level of the p-type material be higher than that of the n-type material by particular energy. This means that the electron affinity of the p-type material is preferably higher than that of the n-type material by particular energy.

If the n-type material has too high a LUMO energy level, electrons are difficult to migrate and, as a result, the solar cell device 100 tends to show a low short-circuit current (Jsc). On the other hand, the open-circuit voltage (Voc) of the solar cell device 100 is determined by the difference between the HOMO energy level of the p-type material and the LUMO energy level of the n-type material. Accordingly, if the n-type material has too low a LUMO energy level, the value of Voc tends to be lowered. This means that highly efficient energy conversion cannot be realized by simply selecting an n-type semiconductor material having a high or low LUMO energy level.

As for the polymer described above, the LUMO energy level can be controlled by selecting the substituent groups. Specifically, compounds having various LUMO energy levels can be obtained by selecting substituent groups in the two kinds of monomers constituting the copolymer. The monomers having desired substituent groups can be synthesized by use of known techniques, such as, esterification, etherification and cross-coupling.

It should be noted, however, that the preferred combination of p- and n-type materials is by no means simply determined only according to the LUMO and HOMO energy levels.

As described above, the active layer 140 in the solar cell device 100 according to the present embodiment contains an n-type semiconductor material and the above-described polymer serving as a p-type semiconductor material. In the solar cell device 100, when the active layer 140 absorbs light, charge separation is caused at the interface between the p- and n-type semiconductors to generate holes and electrons, which are taken out through the electrodes 120 and 160, respectively. There are no particular restrictions on the thickness of the active layer. However, the active layer has a thickness of preferably 10 to 1000 nm, more preferably 50 to 250 nm. Since having a thickness of 10 nm or more, the active layer can be even enough to prevent short circuit. On the other hand, since the active layer has a thickness of 1000 nm or less, the internal resistance can be reduced and the gap between the electrodes can be reduced enough to improve diffusion of the electrons.

The active layer may have a thin-film laminated type structure, in which layers of the p- and n-type semiconductors are laminated, or a bulk hetero-junction type structure, in which the p- and n-type semiconductor materials are mixed. In the thin-film laminated type active layer, there may be a layer comprising a mixture of p- and n-type semiconductor materials (i.e., i-layer) between the p- and n-type semiconductor layers. However, the solar cell device 100 of the present embodiment preferably has a bulk hetero-junction type active layer 140, in which the p- and n-type semiconductor materials are mixed.

The bulk hetero-junction type active layer contains the p- and n-type semiconductor materials. In the active layer, the p- and n-type materials are phase-separated. When the active layer absorbs light, positive charges (holes) and negative charges (electrons) are separated at the phase interfaces and then transferred to the electrodes through the semiconductors. In the bulk hetero-junction type active layer, the structure of phase-separation has influences on the light absorption process, on the diffusion process of excitons, on the dissociation process of excitons (charge generation process) and on the carrier transport process. Accordingly, in order to enhance the photoelectric conversion efficiency of the solar cell device, it is necessary to optimize the structure of phase-separation between the p- and n-type semiconductors in the active layer.

<Formation Method of Active Layer>

There are no particular restrictions on the formation method of the active layer 140, but the active layer is preferably formed by a wet-coating process, such as, spin-coating, ink-jet coating, doctor blade coating, and drop casting. In that case, a solvent capable of dissolving the semiconductor materials, the above-described polymer and the n-type semiconductor is selected to prepare a coating solution containing the polymer and the n-type semiconductor, and then the coating solution is applied to form an active layer 140.

The solvent is not particularly restricted as long as it can dissolve the semiconductor materials homogeneously. Examples of the solvent include: aliphatic hydrocarbons, such as, hexane, heptane, octane, iso-octane, nonane, and decane; aromatic hydrocarbons, such as, toluene, xylene, chlorobenzene, and o-dichlorobenzene; lower alcohols, such as, methanol, ethanol, and propanol; ketones, such as, acetone, methyl ethyl ketone, cyclopentanone, and cyclohexanone; esters, such as, ethyl acetate, butyl acetate, and methyl lactate; halogenated hydrocarbons, such as, chloroform, methylene chloride, dichloroethane, trichloroethane, and trichloroethylene; ethers, such as, ethyl ether, tetrahydrofuran, and dioxane; and amides, such as, dimethylformamide and dimethylacetamide.

<Additive in Coating Solution for Active Layer>

Patent document 3 discloses that the photoelectric conversion efficiency may be improved by adding a low-molecular-weight compound into the coating solution when the bulk hetero-junction type active layer is formed by coating. It is thought that plural factors constitute a mechanism by which a particular additive optimizes the phase-separation structure to improve the photoelectric conversion efficiency. The present applicant presumes one of the factors to be that a particular additive prevents aggregation of the p- or n-type semiconductor material. Specifically, if the coating solution (ink) for the active layer contains no additives, the solvent evaporates immediately after the coating solution is cast. At that time, the p- and n-type semiconductors remaining as residues may form large aggregates. Consequently, the area of joining surface (interface) between the p- and n-type semiconductors decreases to lower the charge generation efficiency.

On the other hand, if the ink containing an additive is cast, the additive is still left even after the solvent evaporates. Since remaining near the p- and/or n-type semiconductors, the additive can prevent aggregation thereof. The additive is thought to evaporate very slowly at room temperature under atmospheric pressure after the ink is cast. According as the additive gradually evaporates, the p- and/or n-type semiconductor materials are presumed to aggregate. Even so, however, the still remaining additive is thought to prevent the aggregation and thereby to make the aggregates of p- and/or n-type materials smaller. Consequently, the resultant active layer can have a phase-separation structure in which the joining area between the p- and n-type semiconductors is large enough to realize higher charge generation efficiency.

On the basis of the above working mechanism, the present applicant presumes that the boiling point of the additive has a large influence on the effect. Specifically, the additive preferably remains for some time in the active layer after the main solvent of the ink evaporates. In view of that, the additive preferably has a boiling point higher than the main solvent of the ink. The boiling points of chlorobenzene and o-dichlorobenzene, which are generally adopted as the main solvent of the ink, are 131° C. and 181° C., respectively. Accordingly, the additive preferably has a boiling point higher than those under atmospheric pressure (1000 hPa). Further, in view of the same, the additive preferably has a vapor pressure lower than the main solvent of the ink at room temperature (25° C.).

On the other hand, however, if having too high a boiling point, the additive is expected not to evaporate completely from the active layer and, as a result, to remain in a large amount in the active layer. In that case, since impurities increase in the active layer, there is a fear of lowering the mobility, namely, of impairing the photoelectric conversion efficiency. Accordingly, it is also preferred for the additive not to have too high a boiling point.

In consideration of the above, the additive has a boiling point higher than the main solvent preferably by 10 to 250° C. inclusive, more preferably by 50 to 150° C. inclusive under ordinary pressure. If the additive has too low a boiling point, the n-type semiconductor material, in particular, tends to aggregate and hence to enlarge the morphology of the active layer insomuch that the active layer may have a rugged surface. Further, the additive is preferably in the form of liquid at room temperature (25° C.) so that the ink can be easily prepared. If the additive is in the form of solid at room temperature when the ink is prepared, it may be difficult to dissolve the additive in the main solvent or otherwise it may take a long stirring time to dissolve the additive even if the additive is finally dissolved. If the additive is in the form of liquid, those problems are avoided.

However, in order to optimize the phase-separation structure, it is important to notice not only the boiling point of the additive but also the affinities thereof with the p- and n-type semiconductor materials. That is because the additive can interact with the p- and n-type semiconductors and hence the crystallinities of the semiconductors may depend on, for example, the structure of the additive.

The additive is, for example, an alkane having substituent groups or an aromatic compound (such as, naphthalene) having substituent groups. Examples of the substituent groups include: aldehyde, oxo, hydroxyl, alkoxy, thiol, thioalkyl, carboxyl, ester, amine, amido, fluoro, chloro, bromo, iodo, halogen, nitrile, epoxy, aromatic group, and arylalkyl. The additive may have either one or more (e.g., two) substituent groups. The substituent group of the alkane is preferably thiol or iodo while that of the aromatic compound, such as naphthalene, is bromo or chloro. As described above, since the additive preferably has a high boiling point, the alkane has preferably 6 or more, further preferably 8 or more carbon atoms. On the other hand, however, since the additive is preferably in the form of liquid at room temperature as described above, the alkane has preferably 14 or less, further preferably 12 or less carbon atoms.

The ink (coating solution for the active layer) contains the additive in an amount of preferably 0.1 to 10 wt % inclusive, more preferably 0.5 to 5 wt % inclusive, based on the total weight of the ink. If the content of the additive is within the above range, the additive left in the active layer can be reduced and, at the same time, the active layer can have a favorable phase-separation structure.

In the manner described above, the active layer 140 of the solar cell device 100 according to the present embodiment can be formed by a coating process, specifically, by casting a coating solution (i.e., ink) that contains the polymer comprising the repeating unit represented by the formula (M1), the n-type semiconductor material, and the additive.

<Electrodes (120, 160)>

The electrode 120 or 160 according to the present embodiment has a function of collecting holes or electrons, respectively, generated by light absorption of the active layer 140. Accordingly, the electrode 120 is preferably suitable for collecting holes while the electrode 160 is preferably suitable for collecting electrons.

At least one of the electrodes 120 and 160 is preferably transparent, and both of them may be transparent. Here, the term "transparent" means that the electrode can transmit 40% or more of sun light. The transparent electrode preferably transmits 70% or more of sun light so that the light can pass through the electrode and reach to the active layer 140. The light transmittance can be measured with a normal spectrophotometer, and the transparency can be evaluated according to average transmittance in the visible range (400 to 800 nm).

Concrete examples of materials for the electrodes 120 and 160 are described below. However, at least one of the electrodes 120 and 160 may be made of two or more materials. For example, the electrode may comprise two or more laminated layers. Further, the materials described below may be subjected to surface treatment, so as to improve the properties (e.g., electrical characteristics, wetting characteristics).

<Electrode (Anode) 120 Suitable for Collecting Holes>

The electrode (anode) suitable for collecting holes is generally made of an electroconductive material having a higher work function than the cathode. The anode 120 having that constitution can smoothly extract holes generated in the active layer 140.

Examples of the material for the anode 120 include: electroconductive metal oxides, such as, nickel oxide, tin oxide, indium oxide, tin-indium oxide (ITO), indium-zirconium oxide (IZO), titanium oxide, and zinc oxide; metals, such as, gold, platinum, silver, chromium, and cobalt; and alloys thereof. Those substances have high work functions, and hence are preferably adopted. Further, they can be layered with an electroconductive polymer material, such as, PEDOT/PSS, which is a polystyrene derivative doped with polystyrene sulfonic acid. Also in view of that, the above substances are preferred. This means that it is possible to provide a buffer layer 130 made of that electroconductive polymer between the anode 120 and the active layer 140. In the case where the anode 120 is layered with the electroconductive polymer, it is also possible to adopt metals suitable for the cathode, for example, aluminum and magnesium, in place of the above materials having high work functions. That is because the electroconductive polymer has a high work function.

Further, it is still also possible to adopt the electroconductive polymer by itself as the material for the anode 120. Examples of the electroconductive polymer include: PEDOT/PSS, which is described above, and materials obtained by doping polypyrrole or polyaniline with iodine or the like.

In the case where the anode 120 is transparent, the material of the anode 120 is preferably an electroconductive transparent metal oxide, such as, ITO, zinc oxide or tin oxide. Among them, ITO is particularly preferred.

There are no particular restrictions on the thickness of the anode 120, but the thickness is preferably 10 nm to 1 μm inclusive, more preferably 50 to 300 nm inclusive. If the anode 120 is too thin, the sheet resistance increases. On the other hand, if being too thick, the anode has poor light transparency. Accordingly, if the anode 120 is transparent, the thickness is preferably so selected that both high light transparency and low sheet resistance can be obtained. There are no particular restrictions on the sheet resistance of the anode 120, but it is normally 1 to 500 Ω/square inclusive, preferably 200 Ω/square or less. The sheet resistance is preferably small enough to extract a large current.

The anode 120 can be produced by a vacuum film-forming process according to vapor-deposition, sputtering or the like or otherwise by a coating process comprising, for example, casting an ink containing nanoparticles and precursors. Here, the term "precursors" means compounds which are subjected to some treatment after the ink is cast and thereby which are converted into materials suitable for the anode 120.

<Electrode (Cathode) 160 Suitable for Collecting Electrons>

The electrode (cathode) suitable for collecting electrons is generally made of an electroconductive material having a lower work function than the anode. The cathode 160 having that constitution can smoothly extract electrons generated in the active layer 140.

Examples of the material for the cathode 160 include: metals, such as, platinum, gold, silver, copper, iron, tin, zinc, aluminum, indium, chromium, lithium, sodium, potassium, cesium, calcium, magnesium, and alloys thereof; inorganic salts, such as, lithium fluoride and cesium fluoride; and metal oxides, such as, nickel oxide, aluminum oxide, lithium oxide and cesium oxide. Since having low work functions, those materials are preferably used for the cathode 160.

Similarly to the anode 120, it is possible to provide a buffer layer 150 between the cathode 160 and the active layer 140. For example, if the buffer layer 130 is made of an electroconductive n-type semiconductor such as titania, the cathode 160 can be made of a material having a high work function. In view of protecting the electrode, the cathode 160 is preferably made of metals, such as, platinum, gold, silver, copper, iron, tin, aluminum, calcium, indium, and alloys thereof.

There are no particular restrictions on the thickness of the cathode 160, but the thickness is preferably 10 nm to 10 μm inclusive, more preferably 50 to 500 nm inclusive. If the cathode 160 is too thin, the sheet resistance increases. On the other hand, if being too thick, the cathode has poor light transparency. Accordingly, if the cathode 160 is transparent, the thickness is preferably so selected that both high light-transmittance and low sheet resistance can be obtained. There are no particular restrictions on the sheet resistance of the cathode 160, but it is normally 500 Ω/square or less, preferably 200 Ω/square or less. There are no particular restrictions on the lower limit of the sheet resistance, but the sheet resistance is normally 1 Ω/square or more. The sheet resistance is preferably small enough to extract a large current.

The cathode 160 can be produced by a vacuum film-forming process according to vapor-deposition, sputtering or the like or otherwise by a coating process comprising, for example, casting an ink containing nanoparticles and precursors.

<Buffer Layer (130, 150)>

The solar cell device 100 according to the present embodiment can comprise one or more buffer layers in addition to a pair of electrodes 120 and 160 and an active layer 140 provided between them. The buffer layer can be categorized into a hole-extracting layer 130 or an electron-extracting layer 150. Normally, the hole-extracting layer 130 is placed between the active layer 140 and the anode 120 and, on the other hand, the electron-extracting layer 150 is placed between the active layer 140 and the cathode 160.

<Hole-Extracting Layer (130)>

There are no particular restrictions on the material of the hole-extracting layer 130 as long as it can improve the efficiency of transporting holes from the active layer 140 into the anode 120. Examples of the material include: electroconductive polymers obtained by doping polythiophene, polypyrrole, polyacetylene, polypenylenediaminepolypyrrole, polyaniline and the like with dopants, such as, sulfonic acids and iodine. Among them, preferred are electroconductive polymers doped with sulfonic acids, and particularly preferred is PEDOT:PSS, which is a polythiophene derivative doped with polystyrene sulfonic acid.

Further, it is possible to adopt a thin film of metal, such as, gold, indium, silver or palladium, as the hole-extracting layer 130. The thin metal film can be alone used as the hole-extracting layer 130, but may be combined with the above electroconductive polymer to form the hole-extracting layer 130.

There are no particular restrictions on the thickness of the hole-extracting layer, but the thickness is normally 1 to 200 nm inclusive, preferably 5 nm or more, further preferably 100 nm or less. If being too thin, the layer has insufficient evenness and tends to cause short circuit. However, if the layer is too thick, the resistance increases and hence it may be difficult to extract holes.

<Electron-Extracting Layer (150)>

There are no particular restrictions on the material of the electron-extracting layer 150 as long as it can improve the efficiency of transporting electrons from the active layer 140 into the cathode 160. The material of the electron-extracting layer is roughly categorized into an inorganic compound or an organic compound. Either or both of them can be used for the electron-extracting layer. For example, the electron-extracting layer 150 may be a laminate of an inorganic compound layer and an organic compound layer.

Preferred examples of the inorganic compound material for the electron-extracting layer include: salts of alkali metals, such as, lithium, sodium, potassium and cesium; and n-type oxide semiconductor compounds, such as, titanium oxide ($TiO_x$) and zinc oxide (ZnO). The salts of alkali metals are preferably fluorides, such as, lithium fluoride, sodium fluoride, potassium fluoride, and cesium fluoride. One of the reasons why those materials are preferred is presumed to be because they reduce the work function of the cathode in combination with cathode materials such as aluminum, and accordingly because they increase the voltage applied to the inside of the solar cell device.

If the salts of alkali metals are adopted as the materials, the electron-extracting layer 150 can be produced by a vacuum film-forming process according to vapor-deposition, sputtering or the like. It is preferred to form the electron-extracting layer 150 according to vapor-deposition by resistance heating. The vacuum vapor-deposition process can reduce damage to other layers such as the active layer 140. In that case, the electron-extracting layer 150 has a thickness of normally 0.1 to 50 nm inclusive, preferably 20 nm or less. If being too thin, the electron-extracting layer 150 has an insufficient effect of improving the electron-extracting efficiency. On the other hand, if being too thick, the electron-extracting layer 150 functions as a series resistor and consequently tends to impair the properties of the device.

If titanium oxide $TiO_x$ is adopted as the material, the electron-extracting layer 150 can be produced by a vacuum film-forming process according to sputtering or the like. However, the layer is preferably formed by a coating process. For example, it is possible to form an electron-extracting layer 150 comprising titanium oxide according to the sol-gel method described in Non-patent document 2. In that case, the electron-extracting layer 150 has a thickness of preferably 0.1 to 100 nm inclusive, more preferably 5 to 50 nm inclusive. If being too thin, the electron-extracting layer 150 has an insufficient effect of improving the electron-extracting efficiency. On the other hand, if being too thick, the electron-extracting layer 150 functions as a series resistor and consequently tends to impair the properties of the device.

If zinc oxide ZnO is adopted as the material, the electron-extracting layer 150 can be produced by a vacuum film-forming process according to sputtering or the like. However, the layer is preferably formed by a coating process. For example, it is possible to form an electron-extracting layer 150 comprising zinc oxide according to the sol-gel method described in Non-patent document 4. In that case, the electron-extracting layer 150 has a thickness of normally 0.1 to 400 nm inclusive, preferably 1 to 50 nm inclusive. If being too thin, the electron-extracting layer 150 has an insufficient effect of improving the electron-extracting efficiency. On the other hand, if being too thick, the electron-extracting layer 150 functions as a series resistor and consequently tends to impair the properties of the device.

Examples of the organic compound material useable for the electron-extracting layer 150 include: Bathocuproine (BCP), Bathophenanthroline (Bphen), (8-hydroxyquinolinato)aluminium (Alq3), boron compounds, oxadiazole compounds, benzimidazole compounds, naphthalenetetracarboxylic anhydride (NTCDA), perylenetetracarboxylic anhydride (PTCDA), phosphine oxide compounds, phosphine sulfide compounds, and electroconductive polymers. However, those by no means restrict the material. Those organic compound materials may be doped with alkali metals or alkaline earth metals.

If the organic compound material is adopted, the electron-extracting layer 150 has a thickness of normally 0.5 to 500 nm inclusive, preferably 1 to 100 nm inclusive. If being too thin, the electron-extracting layer 150 has an insufficient effect of improving the electron-extracting efficiency. On the other hand, if being too thick, the electron-extracting layer 150 functions as a series resistor and consequently tends to impair the properties of the device.

If made of two or more materials in combination, the electron-extracting layer 150 has a thickness of normally 0.1 to 100 nm inclusive, preferably 60 nm or less. If being too thin, the electron-extracting layer 150 has an insufficient effect of improving the electron-extracting efficiency. On the other hand, if being too thick, the electron-extracting layer 150 functions as a series resistor and consequently tends to impair the properties of the device.

<Formation Method of Buffer Layer>

There are no particular restrictions on the formation method of the buffer layers 130 and 150. Processes for forming the layers from some materials are described above. If the materials can be sublimated, the layers can be formed by a vacuum film-forming process according to vapor-deposition or the like. On the other hand, if the materials can be dissolved in solvents, the layers can be formed by a wet-coating process according to spin-coating, ink-jet printing or the like.

<Substance (110)>

The solar cell device 110 according to the present embodiment normally has a substrate 110 serving as a support. Specifically, the electrodes 120 and 160, the active layer 140, and the buffer layers 130 and 150 are provided on the substrate 110. The substrate 110 may be made of any material (substrate material) unless it seriously impairs the effect of the present embodiment. Examples of the substrate material include: inorganic substances, such as, quartz, glass, sapphire, and titania; organic substances, such as, polyethylene terephthalate, polyethylene naphthalate, polyethersulfone, polyimide, nylon, polystyrene, polyvinyl alcohol, ethylene-vinyl alcohol copolymer, fluorine-containing resin film, vinyl chloride, polyolefins (e.g., polyethylene), cellulose, polyvinylidene chloride, aramid, polyphenylene sulfide, polyurethane, polycarbonate, polyacrylate, polynorbornene, and epoxy resin; paper materials, such as, paper and synthetic paper; and composite materials, such as, metals (e.g., stainless steel, titanium, aluminum) coated or laminated with insulating materials. The glass is, for example, soda-lime glass or alkali-free glass. Alkali-free glass is preferred because the less the glass elutes ions, the more it is preferred.

There are no particular restrictions on the shape of the substance, and the substrate may be in the form of, for example, a plate, a film, a sheet or the like. There are also no particular restrictions on the thickness of the substance. However, the thickness is preferably 5 μm or more, further preferably 20 μm or more. On the other hand, it is preferably 20 mm or less, further preferably 10 mm or less. If the substrate is too thin, the solar cell device may be poor in strength. If the substrate is too thick, there is a fear of increasing the cost and the weight. In the case where the substrate is made of glass, the thickness is preferably 0.01 mm or more, further preferably 0.1 mm or more. That is because, if the substrate is too thin, the mechanical strength is so lowered that the substrate may be easily broken. However, if it is too thick, the weight increases too much. Accordingly, the thickness is preferably 10 mm or less, further preferably 3 mm or less.

<Production Process of Solar Cell Device 100>

The solar cell device 100 according to the present embodiment can be produced by forming the electrode 120, the active layer 140 and the electrode 160 in order on the substrate 110 in the manners described above. If the buffer layers 130 and 150 are intended to be provided, the electrode 120, the buffer layer 130, the active layer 140, the buffer layer 150 and the electrode 160 are formed in order on the substrate 110.

A laminate obtained by forming at least the electrode 120, the active layer 140 and the electrode 160 in order on the substrate 110 is preferably subjected to heat treatment (anneal treatment). The anneal treatment often improves thermal stability and durability of the solar cell device 100. One of the reasons of that is presumed to be because the anneal treatment can enhance adhesion among the layers. The temperature of heating is normally 200° C. or less, preferably 180° C. or less, further preferably 150° C. or less. On the other hand, it is normally 50° C. or more, preferably 80° C. or more. If the temperature is too low, it may be impossible to enhance the adhesion sufficiently. However, if the temperature is too high, it is feared that the compounds in the active layer 140, for example, may be thermally decomposed. The anneal treatment can be step-by-step carried out at plural different temperatures.

The time for heating is normally 1 minute or more, preferably 3 minutes or more. However, it is normally 3 hours or less, preferably 1 hour or less. The anneal treatment is preferably terminated when the open circuit voltage, the short-circuit current and the fill factor (which are parameters indicating the solar cell performance) become constant values. In addition, the anneal treatment is preferably carried out under atmospheric pressure and is also preferably carried out in an inert gas atmosphere.

The thin-film solar cell according to an embodiment of the present disclosure can be produced in any manner. For example, according to known techniques, the surface of the above organic thin-film solar cell according to an embodiment of the present disclosure can be covered with a proper protective material so as to improve the weather resistance. Examples of the protective material include: weatherable protective films, UV-cut films, gas barrier films, getter films, and sealants.

Since having a thin thickness and a long lifetime, the thin-film solar cell according to an embodiment of the present disclosure has such high versatility that it can be applied to various electronic products. Examples of the applied products include: electronic tags (often referred to as "electronic shelf labels"), e-book readers, electronic paper, and various sensors. The products equipped with the solar cells of the embodiment as power supply devices can be made thinner and lighter than conventional ones.

Figure 2:
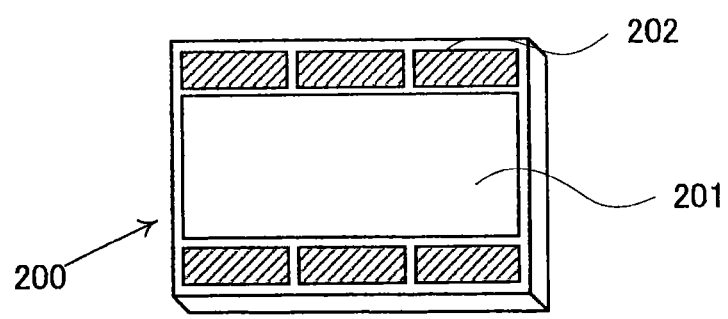
FIG. 2 shows a schematic view of an electronic tag according to an embodiment of the present disclosure.

FIG. 2 shows an example of the electronic tag. The electronic tag 200 is attached on a store shelf or each individual commodity exhibited in a store, so as to display information, such as, name, explanation and price, of the commodity on the displaying screen 201. The electronic tag comprises a built-in wireless receiver with electronic circuits, and thereby the display on the screen can be changed by remote control. The solar cell 202 according to an embodiment of the present disclosure is thin enough not to change largely the small shape of the electronic tag even if the cell is installed in the tag.

Figure 3:
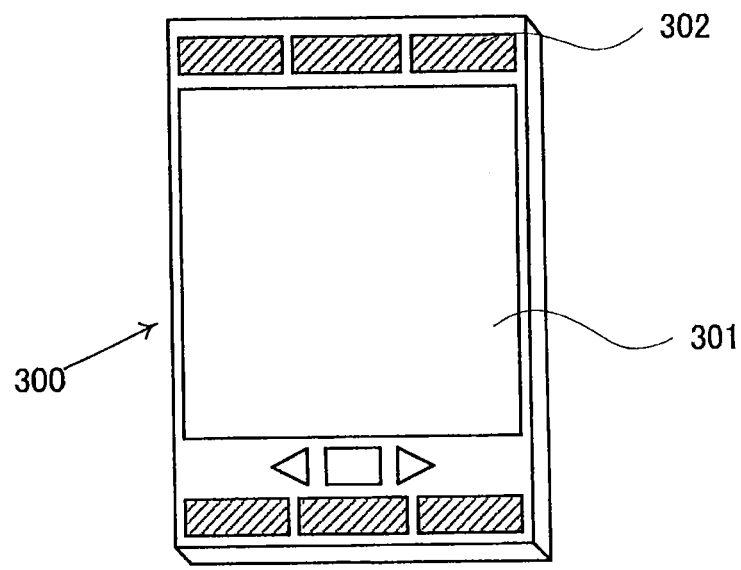
FIG. 3 shows a schematic view of an e-book reader according to an embodiment of the present disclosure.

FIG. 3 shows an e-book reader 300 equipped with the solar cell of the embodiment. The e-book reader generally has operation buttons arranged on the peripheral part of the displaying screen 301, and the peripheral part is also generally so made that users can hold the reader easily. Even if attached on the peripheral part, the solar cell 302 according to an embodiment of the present disclosure is thin and light enough not to change largely the shape of the product.

Figure 4:
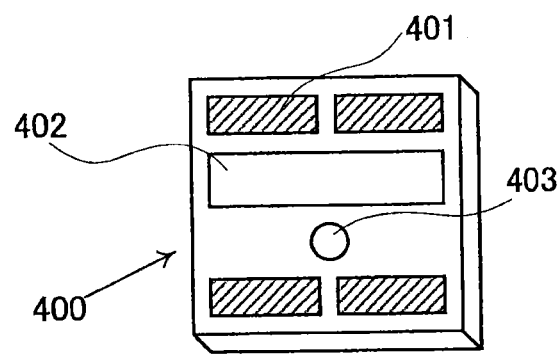
FIG. 4 shows a schematic view of a sensor according to an embodiment of the present disclosure.

Further, the solar cell according to an embodiment of the present disclosure can be applied to various sensors. For example, it can be use for various sensors for realizing home automation. FIG. 4 shows a sensor 400, which is an example of the above sensors. Examples of the sensors include: temperature and humidity sensor, luminance sensor, and motion sensor. The sensor generally comprises a sensing element 403 for the aimed purpose and a displaying screen 402 for setting the sensor or for indicating the status. Further, if the information needs to be sent by wireless, the sensor comprises a transmitter. In the case where the information obtained by various sensors is sent by wireless and centrally controlled, the sensors in themselves may have no displaying screens.

The solar cell 401 of the embodiment is employed for supplying electric power to work those elements. The above sensors are used for controlling the living environment, but they can be also used as security sensors. Those sensors are combined with the solar cell of the embodiment, and thereby it becomes possible to obtain small sensors in which power-supply wirings are unnecessary.

Embodiments of the present disclosure will be concretely explained below by use of the following examples, which by no means restrict the embodiments of the present disclosure.

EXAMPLE 1

Synthesis of poly(4,8-bis(5-(2-ethylhexyl)-thienyl) benzo[1,2-b:4,5-b']dithiophene-2,6-diyl)-alt-(4-(2-ethylhexyloxycarbonyl))-5-fluoro-thieno[3,4-b]thiophene-2,6-diyl)) (P1)

[Formula 18]

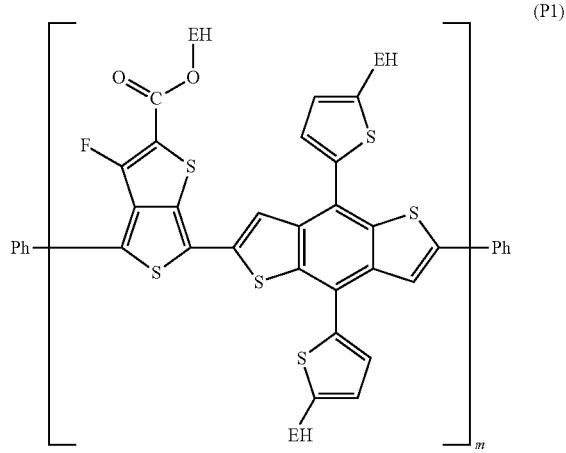

In a nitrogen gas atmosphere, 1.406 g (1.55 mmol) of 2,6-bis(trimethyltin)-4,8-bis(5-(2-ethylhexyl)-dithiophene-2-yl)benzo[1,2-b:4,5-b']dithiophene and 0.078 g (0.0675 mmol) of tetrakis(triphenylphosphine)-palladium (catalyst) were weighed out and placed in a three-necked flask equipped with a three-way stopcock. While argon gas was made to flow into the three-necked flask through the three-way stopcock, a reflux condenser equipped with an argon-introduction tube was mounted on the flask and then a dropping funnel was mounted carefully enough not to let air enter and thereby not to deactivate the catalyst.

The argon-introduction tube was connected to vacuum line so that the connection could be switched between the vacuum line and the argon line. Subsequently, the stopcock was closed and the flask was evacuated, and then argon gas was again introduced into the flask. This procedure was repeated three times. Independently, in a nitrogen gas atmosphere, 0.735 g (1.55 mmol) of 2-ethylhexyl 4,6-dibromo-3-fuloro-thieno[3,4-b]thiophene-2-carbonate was weighed out and placed in another three-necked flask, on which another three-way stopcock was then mounted. One way of the stopcock was connected to the argon line. Another way of the stopcock was opened (while argon gas was made to flow through one of the other ways), and 24 mL of degassed anhydrous toluene was added into the flask by use of a syringe. After the anhydrous toluene dissolved the compound, the solution was sucked up with the syringe. One way of the above first stopcock was opened (while argon gas was made to flow through one of the other ways), and the toluene solution of the compound DM in the syringe was introduced into the above first flask. Further, 6 mL of anhydrous dimethylformamide was weighed out and added with a syringe in the same manner as described above, and then the stopcock was closed.

The three-necked flask was heated at a reflux temperature in an oil bath to conduct the reaction for 12 hours, and then cooled to room temperature. Again independently, in a nitrogen gas atmosphere, 0.129 g of trimethylphenyltin was weighed out and dissolved in 4 ml of anhydrous toluene. After the obtained solution was added into the flask with a syringe in the above manner, the mixture was heated and refluxed for 2 hours. The reaction solution was then cooled to room temperature. Still again separately, in a nitrogen gas atmosphere, 0.125 g of bromobenzene was weighted out and dissolved in 4 ml of anhydrous toluene. The obtained solution was added into the flask with a syringe in the above manner, and then the mixture was heated and refluxed for 2 hours. After cooled to room temperature, the reaction solution was dropped with stirring into 1 L of methanol, so as to precipitate a polymer. The precipitates were collected with a glass filter, and dissolved in chloroform. The obtained solution was purified by use of a celite column to remove the catalyst. The solution was then condensed with an evaporator, and methanol was added therein. The mixture was stirred well and then filtrated through a glass filter to obtain a solid product. The product was vacuum-dried at 60° C. for 4 hours to obtain a brown polymer having metallic luster in an amount of 1.386 g (88.8%).

The product was purified by Soxhlet extraction with ethyl acetate, hexane, toluene, and chlorobenzene in order. The portion extracted with chlorobenzene was evaluated by means of NMR apparatus (JNM-GSX270 [trademark], manufactured by JEOL, Ltd. 1H-NMR, 270 Mhz, CDCl$_3$). The results are as follows:

δ: 8.2-6.5 (broad), 4.6-4.0 (broad), 3.3-2.5 (broad), 2.1-0.6 (m).

The peak attributed to aromatic protons of the benzodi-thiophene ring and of the thiophene ring in the side chain was found in the range of δ 6.5 to 8.2 ppm, the peak attributed to CH2 connecting to the oxygen of ester was also found in the range of 4.0 to 4.6 ppm, the peak attributed to CH2 connecting to the thiophene ring of the side chain was still also found, and the broad peak attributed to all the alkyl groups was further found in the range of 0.5 to 2.2 ppm. According to the obtained results, it was confirmed that the aimed polymer was obtained.

The product was also evaluated by gel permeation chromatography. The polystyrene-reduced weight average molecular weight was measured with GPC system (HPCL: CBM20 [trademark], manufactured by Shimazdu Corporation, column: Shodex K-504), and found to be 94000 (Mw/Mn=2.5). Further, the UV-visible absorption spectrum was measured (with A2000 [trademark], manufactured by Shimazdu Corporation), and consequently it was found that the chloroform solution of the product showed a maximum absorption peak at 697 nm ($\lambda_{max}$).

In the above procedure, 2,6-bis(trimethyltin)-4,8-bis(5-(2-ethylhexyl)dithiophene-2-yl)benzo-[1,2-b:4,5-b']dithiophene was synthesized according to the method [12] described in Patent document 1. Further, 2-ethylhexyl 4,6-dibromo-3-fuloro-thieno-[3,4-b]thiophene-2-carbonate was synthesized according to the method described in Non-patent document 5.

EXAMPLE 2

Synthesis of poly(4,8-bis(5-(2-ethylhexyl)thienyl)benzo[1,2-b:4,5-b']dithiophene-2,6-diyl)-alt-(4-(1-heptylcarbonyl))-5-fluoro-thieno[3,4-b]thiophene-2,6-diyl)) (P2)

[Formula 19]

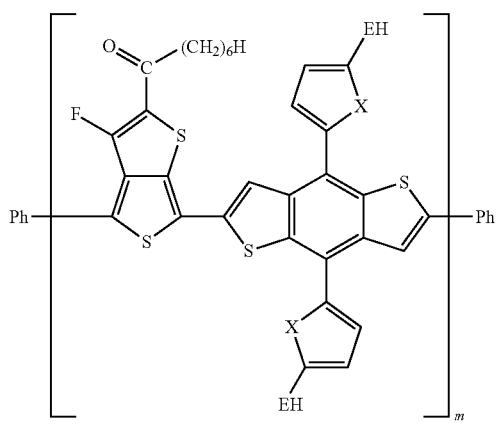

The procedure of Example 1 was repeated except that 2-ethylhexyl 4,6-dibromo-3-fuloro-thieno[3,4-b]-thiophene-2-carbonate was replaced with 4,6-dibromo-3-fuloro-2-(1-heptylcarbonyl)thieno[3,4-b]-thiophene, to obtain a brown polymer almost quantitatively. The product was purified by Soxhlet extraction with ethyl acetate, hexane, and toluene in order. The portion extracted with toluene was evaluated by NMR in the same manner as in Example 1. The results are as follows:

δ: 8.2-6.5 (br), 3.3-2.5 (br), 2.5-0.5 (br).

The peak attributed to aromatic protons of the benzodithiophene ring and of the thiophene ring in the side chain was found in the range of δ 6.5 to 8.2 ppm, the peak attributed to CH2 connecting to the thiophene ring in the side chain and to CH2 connecting to the carbonyl group was also found in the range of 2.5 to 3.3 ppm, and the broad peak attributed to all the alkyl groups was further found in the range of 0.5 to 2.5 ppm. According to the obtained results, it was confirmed that the aimed polymer was obtained.

Further, the molecular weight and the absorption spectrum were evaluated in the same manners as those described in Example 1. As a result, the polystyrene-reduced weight average molecular weight was found to be 140000 (Mw/Mn=3.2), and the maximum absorption peak in the UV-visible absorption spectrum was found at 709 nm ($\lambda_{max}$).

In the above procedure, 4,6-dibromo-3-fuloro-2-(1-heptylcarbonyl)thieno[3,4-b]thiophene serving as the monomer was synthesized according to the following Scheme 1:

Scheme I

[Formula 20]

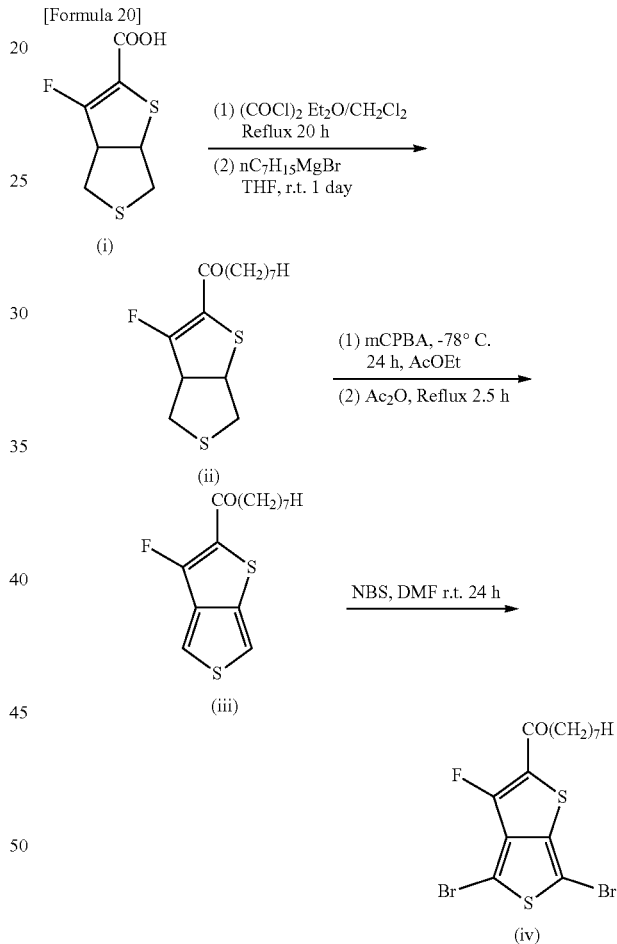

First, a reflux condenser equipped with an argon-introduction tube and a dropping funnel was mounted on a three-necked flask. Further, a magnetic stirrer was installed so as to stir the solution in the following procedure. In the flask, 5.628 g of (27.6 mmol) of (i) 4,6-dihydrothieno[3,4-b]thiophene-2-carboxylic acid was placed and then 30 mL of anhydrous $CH_2Cl_2$ was added. Subsequently, 7.129 g of oxalyl chloride dissolved in 20 ml of anhydrous $CH_2Cl_2$ was added from the dropping funnel, and then the mixture was stirred for 20 hours at room temperature. After 7.103 g of oxalyl chloride dissolved in 100 ml of absolute ether was added, the solution was refluxed for 20 hours. The solvent and an excess amount of the oxalyl chloride were removed from the reaction mixture under reduced pressure, to obtain a dark brown solid. The solid was then dissolved in 80 mL of anhydrous THF. Independently, n-heptylmagnesium bromide was synthesized and dissolved in THF. The THF solution of n-heptylmagnesium bromide (30 mmol) was dropped into the solution of the solid at room temperature, and then the mixture was refluxed for 2 hours. The reaction mixture was then poured into water, and extraction was carried out with $CH_2Cl_2$. After the organic portion was dried with anhydrous magnesium sulfate, the solvent was removed under reduced pressure to obtain a dark brown oily substance. The substance was then purified through a column (silica-gel; toluene:hexane=1:1), to obtain an orange solid (ii). The obtained solid was evaluated by NMR in the manner described above. The results are as follows:

δ: 4.16 (2H, t, J=3.0 Hz), 3.99 (2H, t, J=3.0 Hz), 2.83 (2H, td, J=7.3 Hz, 1.98 Hz), 1.68 (m, 2H), 1.29 (m, 10H), 0.88 (3H, t, J=6.8 Hz).

Thereafter, a reflux condenser equipped with an argon-introduction tube and a dropping funnel was mounted on a three-necked flask equipped with a magnetic stirrer. In the three-necked flask, 1.741 g (6.08 mmol) of the substance (ii) synthesized above was placed and then 135 ml of anhydrous ethyl acetate was poured. After the substance (ii) was dissolved, the solution was cooled in dry-ice/acetone bath to −78° C. Further, 1.458 g (6.08 mmol) of peroxybenzoic acid dissolved in anhydrous ethyl acetate was gradually dropped from the dropping funnel. After the reaction was conducted at −78° C. for 18 hours, the reaction mixture was heated to room temperature and then the solvent was removed under reduced pressure. The residue was mixed with 100 ml of acetic anhydride, and the mixture was refluxed for 2.5 hours. The reaction mixture was purified by column chromatography (silica-gel; hexane:chloroform=3:1 to 2:1), to obtain a pale yellow transparent solid compound (iii) in an amount of 1.356 g.

The obtained compound (iii) was evaluated by NMR in the manner described above. The results are as follows:

δ: 7.69 (1H, t, J=2.6 Hz), 7.27 (1H, t, J=2.6 Hz), 2.95 (2H, td, J=7.4 Hz, 2.3 Hz), 1.79-1.68 (m, 2H), 1.45-1.2 (m, 10H), 0.88 (3H, t, J=6.3 Hz).

Furthermore, a reflux condenser equipped with an argon-introduction tube and a dropping funnel was mounted on a 300 mL three-necked flask equipped with a magnetic stirrer. In the three-necked flask, 1.130 g (3.97 mmol) of the above compound (iii) was placed and then 40 mL of anhydrous DMF was poured. After the compound (iii) was dissolved, 1.769 g (10 mmol) of NBS dissolved in 30 mL of anhydrous DMF was dropped therein at room temperature from the dropping funnel. The mixture was stirred for 1 day, and a sodium thiosulfate solution was poured therein. The mixture was then subjected to extraction with chloroform. After the organic portion was dried with anhydrous magnesium sulfate, the solvent was removed under reduced pressure. The residual liquid was then purified by column chromatography (silica-gel; hexane:chloroform=4:1 to 3:1), to obtain 1.458 g of 4,6-dibromo-3-fluoro-2-octanoyl-thieno[3,4-b]thiophene (iv) in the form of pinkish orange transparent solid. The obtained compound (iv) was evaluated by NMR in the manner described above. The results are as follows:

δ: 2.91 (2H, td, J=7.3 Hz, 2.4 Hz), 1.79-1.68 (m, 2H), 1.45-1.2 (m, 10H), 0.88 (3H, t, J=6.3 Hz).

In the above procedure, 4,6-dihydrothieno[3,4-b]thiophene-2-carboxylic acid (M1) was synthesized according to the method described in Non-patent document 6.

EXAMPLE 3

Synthesis of poly(4,8-bis(5-(2-ethylhexyl)-thienyl) benzo[1,2-b:4,5-b']dithiophene-2,6-diyl)-alt-(4-(2-ethylhexylcarbonyl))-5-fluoro-thieno[3,4-b]thiophene-2,6-diyl)) (P3)

[Formula 21]

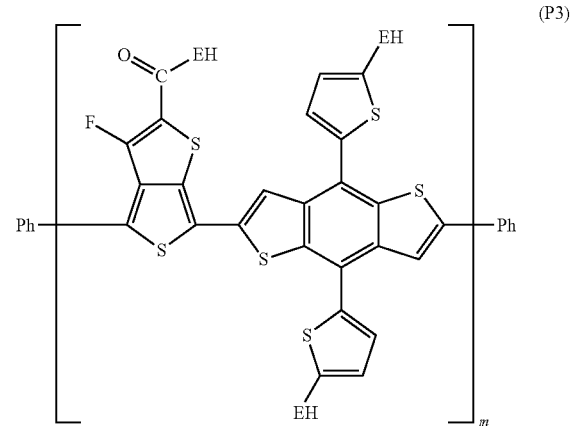

The procedure of Example 1 was repeated except that 2-ethylhexyl 4,6-dibromo-3-fuloro-thieno[3,4-b]thiophene-2-carbonate was replaced with 4,6-dibromo-3-fuloro-2-(2-ethylhexylcarbonyl)-thieno[3,4-b]-thiophene, to obtain a brown polymer almost quantitatively. The product was purified by Soxhlet extraction with ethyl acetate, hexane, and toluene in order. The portion extracted with toluene was evaluated by NMR in the same manner as in Example 1. The results are as follows:

δ: 8.2-6.5 (br), 3.3-2.5 (br), 2.5-0.5 (br).

The peak attributed to aromatic protons of the benzodithiophene ring and of the thiophene ring in the side chain was found in the range of δ 6.5 to 8.2 ppm, the peak attributed to CH2 connecting to the thiophene ring in the side chain and to CH2 connecting to the carbonyl group was also found in the range of 2.5 to 3.3 ppm, and the broad peak attributed to all the alkyl groups was further found in the range of 0.5 to 2.5 ppm. According to the obtained results, it was confirmed that the aimed polymer was obtained.

Further, the molecular weight and the absorption spectrum were evaluated in the same manners as those described in Example 1. As a result, the polystyrene-reduced weight average molecular weight was found to be 53000 (Mw/Mn=2.7), and the maximum absorption peak in the UV-visible absorption spectrum was found at 705 nm ($\lambda_{max}$).

In the above procedure, 4,6-dibromo-3-fuloro-2-(2-ethylhexylcarbonyl)thieno[3,4-b]thiophene serving as the monomer was synthesized according to the method shown by Scheme 1 in the same manner as the synthesis of (ii) except that n-heptylmagnesium bromide was replaced with n-ethylhexylmagnesium bromide.

EXAMPLE 4

Synthesis of poly(4,8-bis(5-(2-ethylhexyl)-thienyl)benzo[1,2-b:4,5-b']dithiophene-2,6-diyl)-alt-(4-(3-heptylcarbonyl))-5-fluoro-thieno[3,4-b]thiophene-2,6-diyl)) (P4)

[Formula 22]

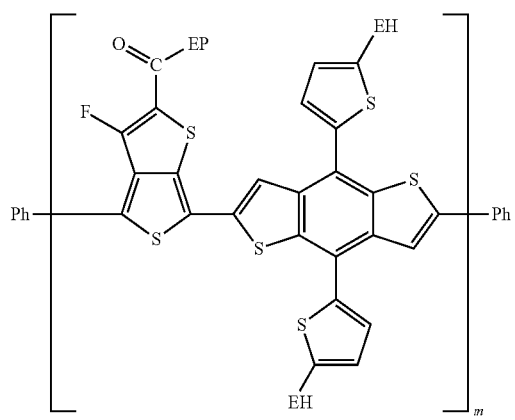

(P4)

The procedure of Example 1 was repeated except that 2-ethylhexyl 4,6-dibromo-3-fuloro-thieno[3,4-b]-thiophene-2-carbonate was replaced with 4,6-dibromo-3-fuloro-2-(3-heptylcarbonyl)-thieno[3,4-b]thiophene, to obtain a brown polymer almost quantitatively. The product was purified by Soxhlet extraction with ethyl acetate, hexane, and toluene in order. The portion extracted with toluene was evaluated by NMR in the same manner as in Example 1. The results are as follows:

δ: 8.2-6.5 (br), 3.3-2.5 (br), 2.5-0.5 (br).

The peak attributed to aromatic protons of the benzodithiophene ring and of the thiophene ring in the side chain was found in the range of δ 6.5 to 8.2 ppm, the peak attributed to CH2 connecting to the thiophene ring in the side chain and to CH2 connecting to the carbonyl group was also found in the range of 2.5 to 3.3 ppm, and the broad peak attributed to all the alkyl groups was further found in the range of 0.5 to 2.5 ppm. According to the obtained results, it was confirmed that the aimed polymer was obtained.

Further, the molecular weight and the absorption spectrum were evaluated in the same manners as those described in Example 1. As a result, the polystyrene-reduced weight average molecular weight was found to be 43000 (Mw/Mn=2.1), and the maximum absorption peak in the UV-visible absorption spectrum was found at 702 nm ($\lambda_{max}$).

In the above procedure, 4,6-dibromo-3-fuloro-2-(3-heptyl)-thieno[3,4-b]thiophene serving as the monomer was synthesized according to the method shown by Scheme 1 in the same manner as the synthesis of (ii) except that n-heptylmagnesium bromide was replaced with 3-heptylmagnesium bromide.

EXAMPLE 5

Synthesis of poly(4,8-bis(5-(2-ethylhexyl)thienyl)benzo[1,2-b:4,5-b']dithiophene-2,6-diyl)-alt-(4-(2-ethylhexylcarbonyl))-5-fluoro-thieno[3,4-b]-thiophene-2,6-diyl)) having $CF_3C_6H_4$ at the terminal (P5)

[Formula 23]

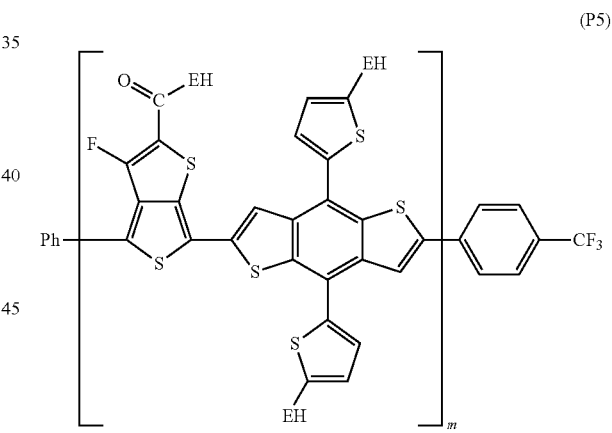

(P5)

The procedure of Example 3 was repeated except for changing the terminal capping agent from bromobenzene into 4-trifluoromethyl-bromobenzene, to obtain a polymer.

The molecular weight and the absorption spectrum of the obtained polymer were evaluated in the manners described above. As a result, the polystyrene-reduced weight average molecular weight was found to be 62000 (Mw/Mn=2.6), and the maximum absorption peak in the UV-visible absorption spectrum was found at 710 nm ($\lambda_{max}$).

EXAMPLE 6

Synthesis of poly(4,8-bis(5-(2-ethylhexyl)-thienyl)benzo[1,2-b:4,5-b']dithiophene-2,6-diyl)-alt-(4-(2-ethylhexylcarbonyl))-5-fluorothieno[3,4-b]-thiophene-2,6-diyl)) having $CF_3C_6H_4$ and $CH_3OC_6H_4$ at the terminals (P6)

[Formula 24]

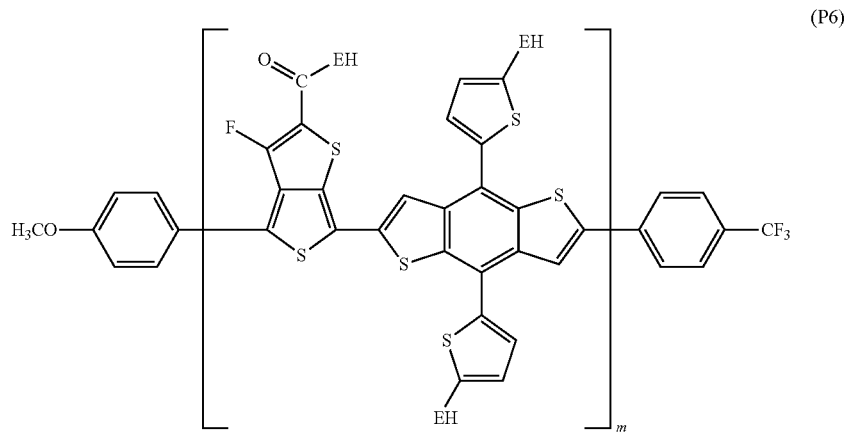

(P6)

The procedure of Example 3 was repeated except for changing the terminal capping agents from bromobenzene and trimethylstannylbenzene into 4-trifluoromethylbromobenzene and 4-methoxy-tri-1-trimethylstannylbenzene, to obtain a polymer.

The molecular weight and the absorption spectrum of the obtained polymer were evaluated in the manners described above. As a result, the polystyrene-reduced weight average molecular weight was found to be 48000 (Mw/Mn=2.1), and the maximum absorption peak in the UV-visible absorption spectrum was found at 705 nm ($\lambda_{max}$).

EXAMPLE 7

Synthesis of poly(4,8-bis(5-(2-ethylhexyl)-thienyl)benzo[1,2-b:4,5-b']dithiophene-2,6-diyl)-alt-(4-(2-ethylhexylcarbonyl))-5-fluoro-thieno[3,4-b]-thiophene-2,6-diyl))/poly(4,8-bis(5-(2-ethylhexyl)thienyl)benzo[1,2-b:4,5-b']dithiophene-2,6-diyl)-alt-(4-(6-bromohexyloxy))-5-fluoro-thieno[3,4-b]-thiophene-2,6-diyl)) copolymer (P7)

[Formula 25]

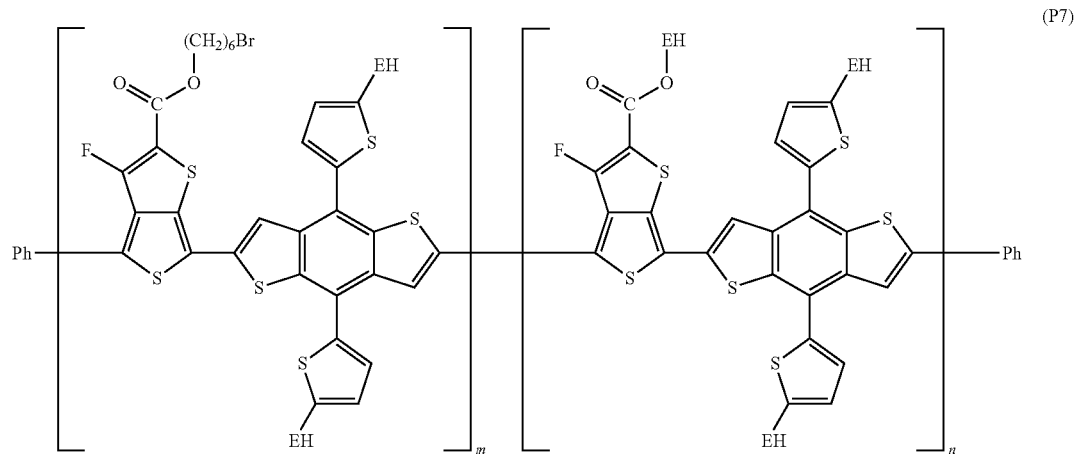

(P7)

The procedure of Example 1 was repeated except that 2-ethylhexyl 4,6-dibromo-3-fuloro-thieno[3,4-b]-thiophene-2-carbonate was replaced with a mixture of 2-ethylhexyl 4,6-dibromo-3-fuloro-thieno[3,4-b]-thiophene-2-carbonate and 6-bromohexyl 4,6-dibromo-3-fuloro-thieno[3,4-b]thiophene-2-carbonate (in which the amount of 6-bromohexyl 4,6-dibromo-3-fluorothieno[3,4-b]thiophene-2-carbonate was 10 mol %), to obtain a brown polymer almost quantitatively. The product was purified by Soxhlet extraction with ethyl acetate, hexane, and toluene in order. The portion extracted with toluene was evaluated.

The molecular weight and the absorption spectrum of the obtained polymer were evaluated in the manners described above. As a result, the polystyrene-reduced weight average molecular weight was found to be 86000 (Mw/Mn=3.0), and the maximum absorption peak in the UV-visible absorption spectrum was found at 662 nm ($\lambda_{max}$).

In the above procedure, 6-bromohexyl 4,6-dibromo-3-fluoro-thieno[3,4-b]thiophene-2-carbonate was synthesized according to the method described in Non-patent document 5 except that 2-ethylhexanol used in the synthesis of 2-ethylhexyl 3-fuloro-4,6-dihydrothieno[3,4-b]thiophene-2-carbonate was replaced with 6-bromohexanol.

EXAMPLE 8

Synthesis of poly(4,8-bis(5-(2-ethylhexyl)-thienyl)benzo[1,2-b:4,5-b']dithiophene-2,6-diyl)-alt-(4-(2-ethylhexylcarbonyl))-5-fluoro-thieno[3,4-b]-thiophene-2,6-diyl))/poly(4,8-bis(5-(2-ethylhexyl)-thienyl)benzo[1,2-b:4,5-b']dithiophene-2,6-diyl)-alt-(3-(6-bromohexy)thiophene-2,5-diyl)) copolymer (P8)

[Formula 26]

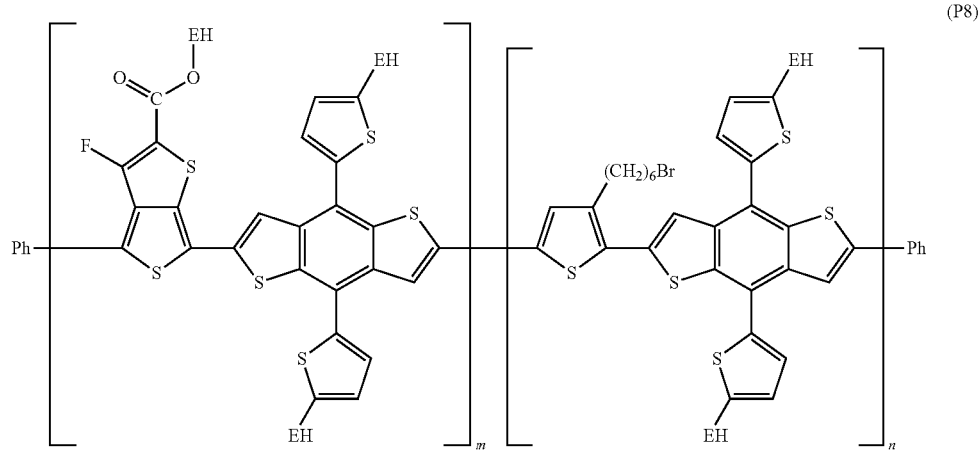

The procedure of Example 1 was repeated except that 2-ethyihexyl 4,6-dibromo-3-fuloro-thieno[3,4-b]-thiophene-2-carbonate was replaced with a mixture of 2-ethyihexyl 4,6-dibromo-3-fuloro-thieno[3,4-b]-thiophene-2-carbonate and 2,5-dibromo-(6-bromo)-thiophene (in which the amount of 2,5-dibromo-(6-bromo)thiophene was 10 mol %), to obtain a brown polymer almost quantitatively. The product was purified by Soxhlet extraction with ethyl acetate, hexane, and toluene in order. The portion extracted with toluene was evaluated.

The molecular weight and the absorption spectrum of the obtained polymer were evaluated in the manners described above. As a result, the polystyrene-reduced weight average molecular weight was found to be 46000 (Mw/Mn=2.1), and the maximum absorption peak in the UV-visible absorption spectrum was found at 651 nm ($\lambda_{max}$).

EXAMPLE 9

Synthesis of poly(4,8-bis(5-(2,4-dioctyl)-thienyl)benzo[1,2-b: 4,5-b']dithiophene-2,6-diyl)-alt-(4-(2-ethylhexyloxycarbonyl))-5-fluoro-thieno[3,4-b]-thiophene-2,6-diyl)) (P9)

[Formula 27]

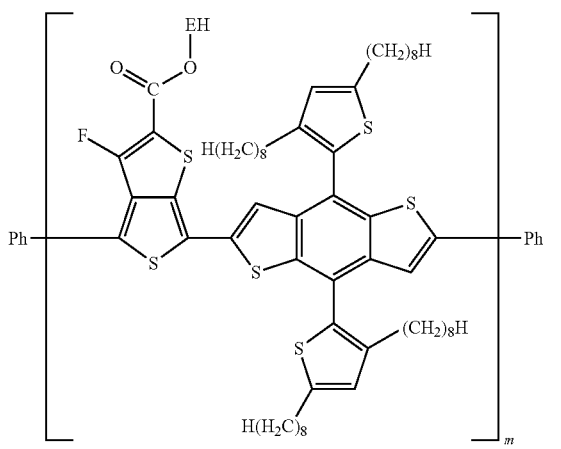

The procedure of Example 3 was repeated except that 4,8-bis((5-(2-ethylhexyl)-2-thienyl)benzo-[1,2-b:4,5-b']dithiophene was replaced with 4,8-bis(3,5-dioctyl)-2-thienyl)benzo[1,2-b;4,5-b']dithiophene, to obtain a brown polymer almost quantitatively.

The molecular weight and the absorption spectrum of the obtained polymer were evaluated in the manners described above. As a result, the polystyrene-reduced weight average molecular weight was found to be 43000 (Mw/Mn=2.3), and the maximum absorption peak in the UV-visible absorption spectrum was found at 686 nm ($\lambda_{max}$).

In the above procedure, 4,8-bis(3,5-dioctyl)-2-thienyl)benzo[1,2-b;4,5-b']dithiophene was synthesized according to the method described in Non-patent document 1.

EXAMPLE 10

Synthesis of poly(4,8-bis(5-(2-ethylhexyl)furanyl)benzo[1,2-b:4,5-b']dithiophene-2,6-diyl)-alt-(4-(2-ethylhexylcarbonyl))-5-fluoro-thieno[3,4-b]-thiophene-2,6-diyl)) (P10)

[Formula 28]

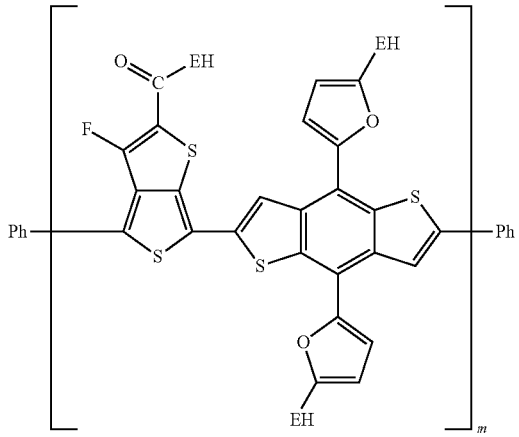

The procedure of Example 3 was repeated except that 4,8-bis((5-(2-ethylhexyl)-2-thienyl)benzo-[1,2-b:4,5-b']dithiophene was replaced with 4,8-bis(5-(2-ethylhexyl)-2-furanyl)benzo[1,2-b;4,5-b']dithiophene, to obtain a brown polymer almost quantitatively. The product was purified by Soxhlet extraction with ethyl acetate, hexane, and toluene in order. The portion extracted with toluene was evaluated by NMR in the same manner as in Example 1. The results are as follows:

δ: 8.2-6.5 (br), 3.3-2.5 (br), 2.5-0.5 (br).

The peak attributed to aromatic protons of the benzodithiophene ring and of the furan ring in the side chain was found in the range of δ 6.3 to 8.0 ppm, the peak attributed to CH2 connecting to the furan ring in the side chain and to CH2 connecting to the carbonyl group was also found in the range of 2.5 to 3.3 ppm, and the broad peak attributed to all the alkyl groups was further found in the range of 0.5 to 2.5 ppm. According to the obtained results, it was confirmed that the aimed polymer was obtained.

Further, the molecular weight and the absorption spectrum of the obtained polymer were evaluated in the manners described above. As a result, the polystyrene-reduced weight average molecular weight was found to be 38000 (Mw/Mn=2.2), and the maximum absorption peak in the UV-visible absorption spectrum was found at 690 nm ($\lambda_{max}$).

In the above procedure, 4,8-bis(2-(5-(2-ethyl-hexyl))furanyl)benzo[1,2-b;4,5-b']dithiophene was synthesized according to the method described in Non-patent document 1 except for replacing 2-ethyihexylthiophene with 2-ethylhexylfuran.

EXAMPLE 11

Synthesis of poly(4,8-bis(5-(2-ethylhexyl)furanyl)benzo[1,2-b:4,5-b']dithiophene-2,6-diyl)-alt-(4-(2-ethylhexyloxycarbonyl))-5-fluoro-thieno[3,4-b]thiophene-2,6-diyl)) (P11)

[Formula 29]

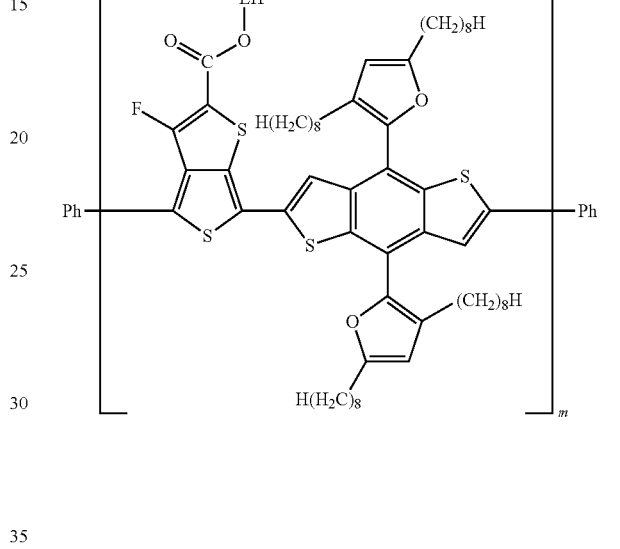

The procedure of Example 1 was repeated except that 4,8-bis((5-(2-ethylhexyl)-2-thienyl)benzo-[1,2-b:4,5-b']dithiophene was replaced with 4,8-bis-((5-(2-ethylhexyl)-2-furanyl)benzo[1,2-b:4,5-b']dithiophene, to obtain a brown polymer almost quantitatively. The product was purified by Soxhlet extraction with ethyl acetate, hexane, and toluene in order. The portion extracted with toluene was evaluated by NMR in the same manner as in Example 1. The results are as follows:

δ: 8.2-6.5 (br), 4.0-4.6 (br), 2.2-2.5 (br), 2.2-0.5 (br).

The peak attributed to aromatic protons of the benzodithiophene ring and of the furan ring in the side chain was found in the range of δ 6.3 to 8.0 ppm, the peak attributed to CH2 connecting to the oxygen atom of the ester was also found in the range of 4.0 to 4.6 ppm, the peak attributed to CH2 connecting to the furan ring in the side chain was still also found in the range of 2.2 to 2.5 ppm, and the broad peak attributed to all the alkyl groups was further found in the range of 0.5 to 2.2 ppm. According to the obtained results, it was confirmed that the aimed polymer was obtained.

Further, the molecular weight and the absorption spectrum of the obtained polymer were evaluated in the manners described above. As a result, the polystyrene-reduced weight average molecular weight was found to be 98000 (Mw/Mn=4.2), and the maximum absorption peak in the UV-visible absorption spectrum was found at 697 nm ($\lambda_{max}$).

EXAMPLE 12

Synthesis of poly(4,8-bis(5-(2-ethylhexyl)-thienyl)benzo[1,2-b:4,5-b']dithiophene-2,6-diyl)-alt-(4-(2-ethylhexylcarbonyl))-5-fluoro-thieno[3,4-b]-thiophene-2,6-diyl))/poly(4,8-bis(5-(2-ethylhexyl)-thienyl)benzo[1,2-b:4,5-b ']dithiophene-2,6-diyl)-alt-(4-(6-[1-oxo-3-phenyl-2-propene-1-yl]hexyloxycarbonyl))-5-fluoro-thieno[3,4-b]thiophene-2,6-diyl)) copolymer (P12)

[Formula 30]

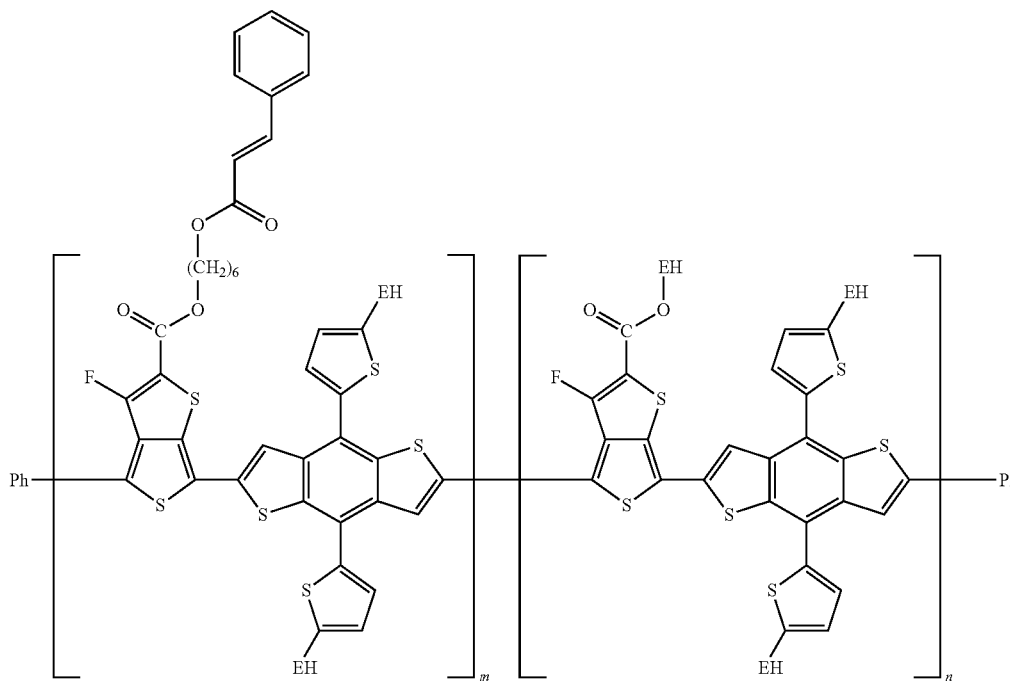

(P12)

The procedure of Example 7 was repeated except that 6-bromohexyl 4,6-dibromo-3-fuloro-thieno[3,4-b]-thiophene-2-carbonate was replaced with (6-[1-oxo-3-phenyl-2-propene-1-yl]hexyl) 4,6-dibromo-3-fuloro-thieno[3,4-b]thiophene-2-carbonate, to obtain a brown polymer almost quantitatively. The product was purified by Soxhlet extraction with ethyl acetate, hexane, and toluene in order. The portion extracted with toluene was evaluated.

The molecular weight and the absorption spectrum of the obtained polymer were evaluated in the manners described above. As a result, the polystyrene-reduced weight average molecular weight was found to be 56000 (Mw/Mn=2.4), and the maximum absorption peak in the UV-visible absorption spectrum was found at 672 nm ($\lambda_{max}$).

In the above procedure, (6-[1-oxo-3-phenyl-2-propene-1-yl]hexyl) 4,6-dibromo-3-fuloro-thieno[3,4-b]-thiophene-2-carbonate was synthesized in the following manner.

In an argon gas atmosphere, 4,6-dibromo-3-fuloro-thieno[3,4-b]thiophene-2-carbonic acid (2 mmol) was placed in a three-necked flask equipped with a reflux condenser and a dropping funnel, and then 30 mL of anhydrous toluene and a few drops of anhydrous DMF were added therein. Subsequently, oxalyl chloride (4 mmol) dissolved in 20 ml of anhydrous toluene was gradually dropped therein at room temperature. After left at room temperature for 30 minutes, the mixture was heated at 70° C. for 2 hours and then the solvent and excess oxalyl chloride were removed under reduced pressure. The reaction residue was dissolved in 30 mL of chloroform. To the solution, (6-hydroxyhexyl)cinnamate (2 mmol) dissolved in 20 mL of chloroform and triethylamine (2 mmol) dissolved in 30 mL of chloroform were dropped at room temperature in an argon gas atmosphere. Thereafter, the reaction was allowed to proceed for 4 hours at room temperature, and water was added. The reaction mixture was subjected to extraction with chloroform, and the chloroform portion was washed with diluted hydrochloric acid and then dried with anhydrous magnesium sulfate. The solvent was removed under reduced pressure to condense the product, which was then purified by silica gel column chromatography to obtain a solution of (6-cinnamoyloxyhexyl)4,6-dibromo-3-fuloro-thieno-[3,4-b]thiophene-2-carbonate.

NMR (CDCL3, δ): 7.68 (d, 1H), 7.55-7.50 (m, 2H), 7.45-7.35 (m, 3H), 6.44 (d, 1H), 4.22 (t, 6.4 Hz), 4.18 (t, 6.4 Hz), 1.75 (m, 2H), 1.64 (m, 2H), 1.56-1.42 (m, 4H)

In the above procedure, (6-hydroxyhexyl)cinnamate was synthesized by the method described in Polymer Bulletin 25, 217 (1991). Further, 4,6-dibromo-3-fuloro-thieno[3,4-b]thiophene-2-carbonic acid was obtained in the following manner. In a flask, 10 mmol of hexyl 4,6-dibromo-3-fuloro-thieno[3,4-b]thiophene-2-carbonate was placed and 50 mL of methanol was added. Further, 1 g of sodium hydroxide dissolved in 50 mL of water was added, and then the mixture was refluxed for 16 hours. After the mixture was cooled to room temperature, 300 mL of water and hydrochloric acid were added to make the mixture acidic. The reaction mixture was then subjected to extraction with ethyl acetate, and the ethyl acetate portion was dried with anhydrous magnesium sulfate. After the solvent was removed under reduced pressure, the reaction product was purified by silica gel column chromatography to obtain the aimed compound.

EXAMPLE 13

Synthesis of poly(4,8-bis(5-(2-ethylhexyl)-thienyl)benzo[1,2-b:4,5-b']dithiophene-2,6-diyl)-alt-(4-(2-ethylhexyloxycarbonyl))-5-fluoro-thieno[3,4-b]-thiophene-2,6-diyl))/poly(4,8-bis(5-(2-ethylhexyl)-thienyl)benzo[1,2-b:4,5-b']dithiophene-2,6-diyl)-alt-(4-(2-anthracenoxycarbonyl))-5-fluoro-thieno[3,4-b]-thiophene-2,6-diyl)) copolymer (P13)

[Formula 31]

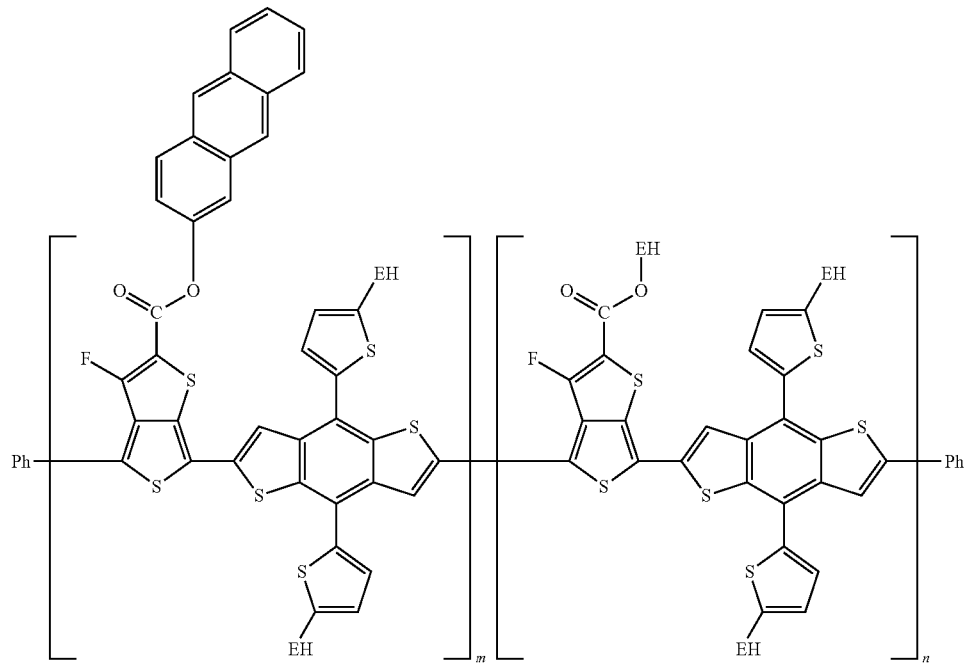

(P13)

The procedure of Example 7 was repeated except that 6-bromohexyl 4,6-dibromo-3-fuloro-thieno[3,4-b]-thiophene-2-carbonate was replaced with 10 mol % of (2-anthracenyl)4,6-dibromo-3-fuloro-thieno[3,4-b]-thiophene-2-carbonate, to obtain a brown polymer almost quantitatively. The product was purified by Soxhlet extraction with ethyl acetate, hexane, and toluene in order. The portion extracted with toluene was evaluated.

The molecular weight and the absorption spectrum of the obtained polymer were evaluated in the manners described above. As a result, the polystyrene-reduced weight average molecular weight was found to be 46000 (Mw/Mn=1.9), and the maximum absorption peak in the UV-visible absorption spectrum was found at 668 nm ($\lambda_{max}$).

In the above procedure, (2-anthracenyl) 4,6-dibromo-3-fuloro-thieno[3,4-b]thiophene-2-carbonate was synthesized in the following manner. In an argon gas atmosphere, 4,6-dibromo-3-fuloro-thieno[3,4-b]-thiophene-2-carbonic acid (2 mmol) was placed in a three-necked flask equipped with a reflux condenser and a dropping funnel, and then 30 mL of anhydrous toluene and a few drops of anhydrous DMF were added therein. Subsequently, oxalyl chloride (60 mmol) dissolved in 20 ml of anhydrous toluene was gradually dropped therein at room temperature. After left at room temperature for 30 minutes, the mixture was heated at 70° C. for 2 hours and then the solvent and excess oxalyl chloride were removed under reduced pressure. The reaction residue was dissolved in 30 mL of chloroform. To the solution, 2-hydroxyanthracene (2 mmol) dissolved in 20 mL of chloroform and triethylamine (2 mmol) dissolved in 30 mL of chloroform were dropped at room temperature in an argon gas atmosphere. Thereafter, the reaction was allowed to proceed for 4 hours at room temperature, and water was added. The reaction mixture was subjected to extraction with chloroform, and the chloroform portion was washed with diluted hydrochloric acid and then dried with anhydrous magnesium sulfate. The solvent was removed under reduced pressure to condense the product, which was then purified by silica gel column chromatography to obtain the aimed compound.

NMR: 7.25-7.28 (m, 1H), 7.46-7.49 (m, 2H), 7.55 (s, 1H), 7.98-8.04 (m, 3H), 8.38 (s, 1H), 8.44 (s, 1H)

EXAMPLE 14

Synthesis of poly(4,8-bis(5-(2-ethylhexyl)-thienyl) benzo[1,2-b:4,5-b']dithiophene-2,6-diyl)-alt-(4-(2-ethylhexyloxycarbonyl))-5-fluoro-thieno[3,4-b]-thiophene-2,6-diyl))/poly(4,8-bis(5-(2-ethylhexyl)-thienyl)benzo[1,2-b:4,5-b']dithiophene-2,6-diyl)-alt-(4-(8-oxobicyclo[4,2.0]octa-1,3,5-triene-4-yl) oxycarbonyl)-5-fluoro-thieno[3,4-b]thiophene-2,6-diyl)) copolymer (P14)

[Formula 32]

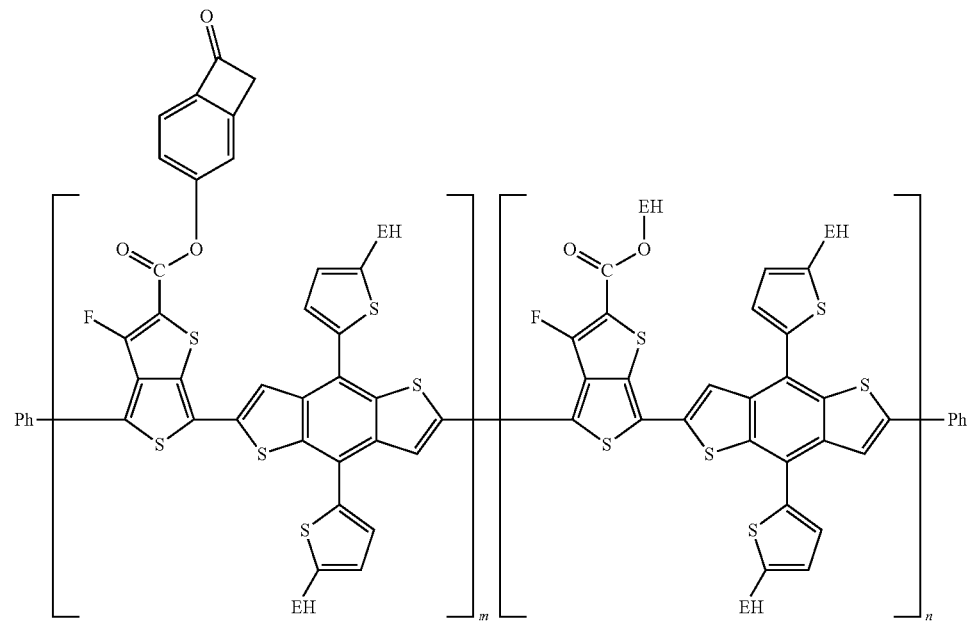

(P14)

The procedure of Example 7 was repeated except that 6-bromohexyl 4,6-dibromo-3-fuloro-thieno[3,4-b]-thiophene-2-carbonate was replaced with 10 mol % of (8-oxobicyclo[4,2.0]octa-1,3,5-triene-4-yl)4,6-dibromo-3-fuloro-thieno[3,4-b]thiophene-2-carbonate, to obtain a brown polymer almost quantitatively. The product was purified by Soxhlet extraction with ethyl acetate, hexane, and toluene in order. The portion extracted with toluene was evaluated.

The molecular weight and the absorption spectrum of the obtained polymer were evaluated in the manners described above. As a result, the polystyrene-reduced weight average molecular weight was found to be 56000 (Mw/Mn=2.3), and the maximum absorption peak in the UV-visible absorption spectrum was found at 688 nm ($\lambda_{max}$).

In the above procedure, (8-oxobicyclo[4,2.0]octa-1,3,5-triene-4-yl)4,6-dibromo-3-fuloro-thieno-[3,4-b]thiophene-2-carbonate was synthesized in the following manner.

In an argon gas atmosphere, 4,6-dibromo-3-fuloro-thieno [3,4-b]thiophene-2-carbonic acid (2 mmol) was placed in a three-necked flask equipped with a reflux condenser and a dropping funnel, and then 30 mL of anhydrous toluene and a few drops of anhydrous DMF were added therein. Subsequently, oxalyl chloride (60 mmol) dissolved in 20 ml of anhydrous toluene was gradually dropped therein at room temperature. After left at room temperature for 30 minutes, the mixture was heated at 70° C. for 2 hours and then the solvent and excess oxalyl chloride were removed under reduced pressure. The reaction residue was dissolved in 30 mL of chloroform. To the solution, 4-hydroxybenzocyclobutanone (2 mmol) dissolved in 20 mL of chloroform and triethylamine (2 mmol) dissolved in 30 mL of chloroform were dropped at room temperature in an argon gas atmosphere. Thereafter, the reaction was allowed to proceed for 4 hours at room temperature, and water was added. The reaction mixture was subjected to extraction with chloroform, and the chloroform portion was washed with diluted hydrochloric acid and then dried with anhydrous magnesium sulfate. The solvent was removed under reduced pressure to condense the product, which was then purified by silica gel column chromatography to obtain (8-oxobicyclo[4,2.0]octa-1,3,5-triene-4-yl) 4,6-dibromo-3-fuloro-thieno-[3,4-b]thiophene-2-carbonate.

NMR: 7.18 (m, 3H), 3.81 (s, 2H)

EXAMPLE 15

Synthesis of poly(4,8-bis(5-(2-ethylhexyl)-thienyl)benzo[1,2-b:4,5-b']dithiophene-2,6-diyl)-alt-(4-(2-ethylhexyloxycarbonyl))-5-fluoro-thieno[3,4-b]-thiophene-2,6-diyl))/poly(4,8-bis(5-(2-ethylhexyl)-thienyl)benzo[1,2-b:4,5-b']dithiophene-2,6-diyl)-alt-(4-(2-oxo-2H-benzopyran-6-yl)oxycarbonyl)-5-fluoro-thieno[3,4-b]thiophene-2,6-diyl)) copolymer (P15)

[Formula 33]

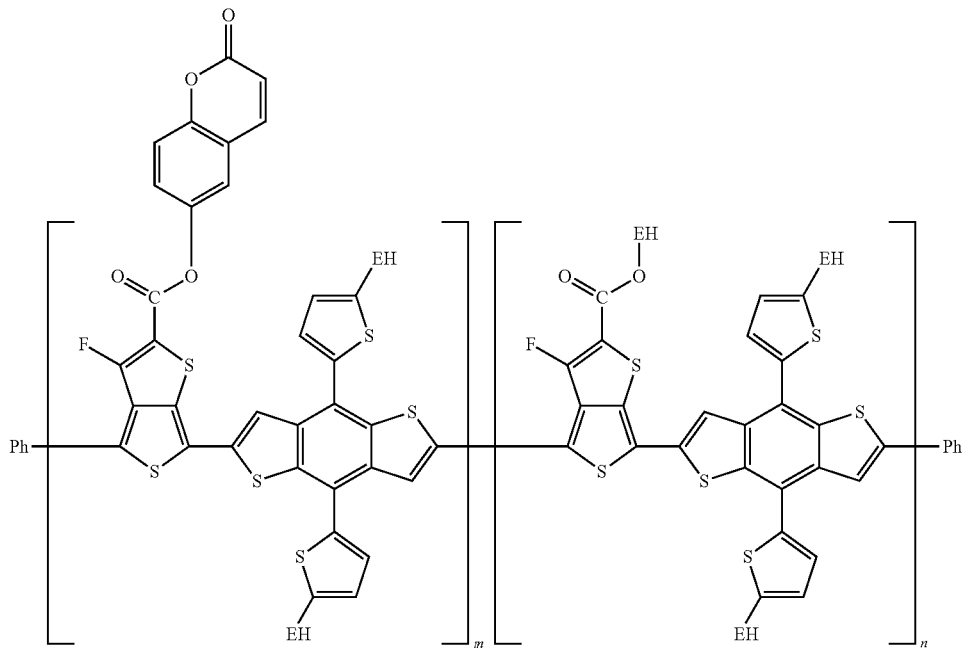

(P15)

The procedure of Example 7 was repeated except that 6-bromohexyl 4,6-dibromo-3-fuloro-thieno[3,4-b]-thiophene-2-carbonate was replaced with 10 mol % of (2-oxo-2H-benzopyran-6-yl)4,6-dibromo-3-fuloro-thieno[3,4-b]thiophene-2-carbonate, to obtain a brown polymer almost quantitatively. The product was purified by Soxhlet extraction with ethyl acetate, hexane, and toluene in order. The portion extracted with toluene was evaluated.

The molecular weight and the absorption spectrum of the obtained polymer were evaluated in the manners described above. As a result, the polystyrene-reduced weight average molecular weight was found to be 76000 (Mw/Mn=2.8), and the maximum absorption peak in the UV-visible absorption spectrum was found at 675 nm ($\lambda_{max}$).

In the above procedure, (2-oxo-2H-benzopyran-6-yl) 4,6-dibromo-3-fuloro-thieno[3,4-b]-thiophene-2-carbonate was synthesized in the following manner.

In an argon gas atmosphere, 4,6-dibromo-3-fuloro-thieno[3,4-b]thiophene-2-carbonic acid (2 mmol) was placed in a three-necked flask equipped with a reflux condenser and a dropping funnel, and then 30 mL of anhydrous toluene and a few drops of anhydrous DMF were added therein. Subsequently, oxalyl chloride (60 mmol) dissolved in 20 ml of anhydrous toluene was gradually dropped therein at room temperature. After left at room temperature for 30 minutes, the mixture was heated at 70° C. for 2 hours and then the solvent and excess oxalyl chloride were removed under reduced pressure. The reaction residue was dissolved in 30 mL of chloroform. To the solution, 6-hydroxycoumarin (2 mmol) dissolved in 20 mL of chloroform and triethylamine (2 mmol) dissolved in 30 mL of chloroform were dropped at room temperature in an argon gas atmosphere. Thereafter, the reaction was allowed to proceed for 4 hours at room temperature, and water was added. The reaction mixture was subjected to extraction with chloroform, and the chloroform portion was washed with diluted hydrochloric acid and then dried with anhydrous magnesium sulfate. The solvent was removed under reduced pressure to condense the product, which was then purified by silica gel column chromatography to obtain (2-oxo-2H-benzopyran-6-yl)4,6-dibromo-3-fuloro-thieno[3,4-b]thiophene-2-carbonate.

COMPARATIVE EXAMPLE 1

Synthesis of poly(4,8-bis-(2-ethylhexyloxy)benzo[1,2-b:4,5-b']dithiophene-2,6-diyl)-alt-(4-ethylhexyloxycarbonyl)-5-fluoro-thieno-[3,4-b]thiophene-2,6-diyl)) (PTB-7)

[Formula 34]

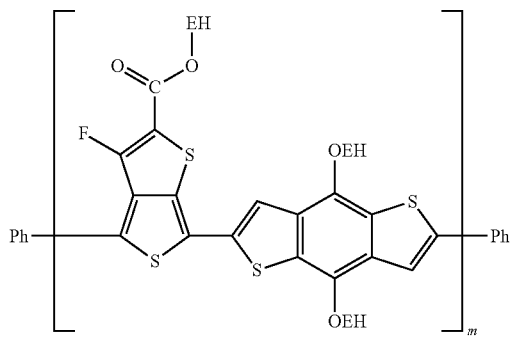

(PTB-7)

According to the method described in Non-patent document 5, PTB-7 was synthesized. The procedure was described below in detail. In a nitrogen gas atmosphere, 3.942 g (8.35 mmol) of 2-ethylhexyl 4,6-dibromo-3-fluoro-thieno[3,4-b]thiophene-2-carboxylate, 6.443 g (8.35 mmol) of 2,6-bis(trimethyltin)-4,8-bis(2-ethylhexyloxy)benzo[1,2-b:4,5-b']-dithiophene and 0.405 g of tetrakis(triphenylphosphine)-palladium (catalyst) were weighed out and placed in a three-necked flask equipped with a three-way stopcock. While argon gas was made to flow into the three-necked flask through the three-way stopcock, a reflux condenser equipped with an argon-introduction tube was mounted on the flask so carefully that air might not enter to deactivate the catalyst. The argon-introduction tube was connected to vacuum line so that the connection could be switched between the vacuum line and the argon line.

Subsequently, the stopcock was closed and the flask was evacuated, and then argon gas was again introduced into the flask. This procedure was repeated three times.

After 132 mL of degassed anhydrous toluene was weighed out with a syringe, one way of the stopcock was opened and then the toluene was added (while argon gas was made to flow through one of the other ways). Further, 33 mL of degassed anhydrous dimethylformamide (DMF) was weighed out and added to the flask with a syringe in the same manner as described above, and then the stopcock was closed. The three-necked flask was heated at a reflux temperature in an oil bath to conduct the reaction for 12 hours, and then cooled to room temperature.

In a nitrogen gas atmosphere, 0.202 g (0.84 mmol) of trimethylphenyltin was weighed out and dissolved in 10 ml of degassed anhydrous toluene. After the obtained solution was added into the flask with a syringe in the above manner, the mixture was refluxed for 2 hours. The reaction solution was then cooled to room temperature. In a nitrogen gas atmosphere, 0.184 g (1.17 mmol) of bromobenzene was weighted out and dissolved in 10 ml of degassed anhydrous toluene. The obtained solution was added into the flask with a syringe in the above manner, and then the mixture was refluxed for 2 hours. After cooled to room temperature, the reaction solution was dropped with stirring into 1 L of methanol, so as to precipitate a polymer. The precipitates were collected with a glass filter, and dissolved in chloroform. The obtained solution was purified by use of a celite column to remove the catalyst. The solution was condensed with an evaporator, and then the polymer was re-precipitated from methanol and filtrated to obtain a solid product. The product was vacuum-dried at 60° C. for 8 hours to obtain a brown polymer (PTB-7) having metallic luster in an amount of 2.928 g.

The obtained PTB-7 was evaluated by NMR in the manner described above. The results are as follows:

δ: 7.9-6.6 (2H, broad), 4.8-3.7 (6H, broad), 2.4-0.6 (45H, m).

Further, the molecular weight and the absorption spectrum of the obtained PTB-7 were evaluated in the manners described above. As a result, the polystyrene-reduced weight average molecular weight was found to be 170000 (Mw/Mn=2.2), and the maximum absorption peak in the UV-visible absorption spectrum (measured with A2000 [trademark], manufactured by Shimazdu Corporation) was found at 671 nm ($\lambda_{max}$)

COMPARATIVE EXAMPLE 2

Synthesis of poly((4,8-bis-(2-ethylhexyl)thiophene-2-yl)benzo[1,2-b:4,5-b']-dithiophene-2,6-diyl)-alt-(4-(2-ethylhexanoyl)-thieno[3,4-b]thiophene))-2,6-diyl) (PBDTTT-CT)

[Formula 35]

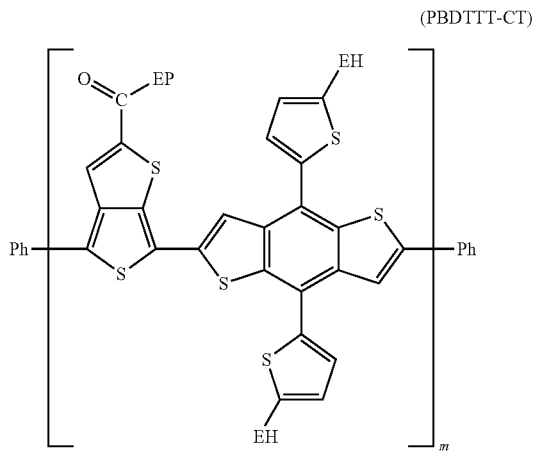

(PBDTTT-CT)

According to the method described in Non-patent document 1, PBDTTT-CT was synthesized.

The molecular weight and the absorption spectrum of the obtained polymer were evaluated in the manners described above. As a result, the polystyrene-reduced weight average molecular weight was found to be 57000 (Mw/Mn=2.7), and the maximum absorption peak in the UV-visible absorption spectrum (measured with A2000 [trademark], manufactured by Shimazdu Corporation) was found at 685 nm ($\lambda_{max}$).

COMPARATIVE EXAMPLE 3

Synthesis of poly(4,8-bis-(2-ethylhexyloxy)benzo[1,2-b:4,5-b']dithiophene-2,6-diyl)-alt-(4-octanoyl-5-fluoro-thieno[3,4-b]-thiophene-2-carboxylate)-2,6-diyl)) (PBDTTT-CF)

[Formula 36]

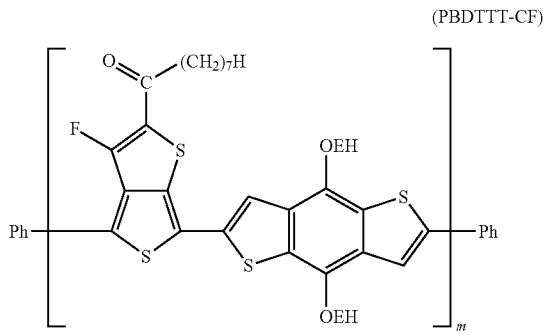

(PBDTTT-CF)

According to the method described in Non-patent document 7, PBDTTT-CF was synthesized.

The molecular weight and the absorption spectrum of the obtained polymer were evaluated in the manners described above. As a result, the polystyrene-reduced weight average molecular weight was found to be 61000 (Mw/Mn=3.0), and the maximum absorption peak in the UV-visible absorption spectrum was found at 685 nm ($\lambda_{max}$).

Production of Solar Cell devices S1 to S15 and SC1 to SC3
<Preparation of Coating Solution for Active Layer>

Each of the polymers P1 to P15 and the three comparative polymers, which were to serve as p-type semiconductor materials, was individually mixed with PC70BM, which was to serve as an n-type semiconductor material, in a weight ratio of 1:1.5, and the mixture was so dissolved in chlorobenzene under a nitrogen atmosphere that the concentration might be 2.0 wt %. After 1,8-diiodooctane was added in an amount of 3 wt % based on the total weight of the solution, the solution was stirred at 120° C. for 1 hour with a hot stirrer. The resultant solution was cooled to room temperature, and filtrated through a 0.20 μm polytetrafluoroethylene (PTFE) filter to obtain a coating solution of each polymer for the active layer.

<Production of Solar Cell Device>

A glass substrate provided with a patterned indium-tin oxide (ITO) transparent electroconductive membrane was subjected to ultrasonic cleaning with a surfactant, washing with ultrapure water, and ultrasonic cleaning with ultrapure water in order, and then dried with nitrogen blow. The substrate was heated for 5 minutes at 120° C. in air to dry, and finally subjected to UV-ozone cleaning. The substrate was then spin-coated with an aqueous dispersion of poly(3,4-ethylenedioxy-thiophene)poly(styrene sulfonic acid) (PH500 [trademark], manufactured by Heraeus GmbH), and heated on a hot plate for 5 minutes at 140° C. in air to form a hole-extracting layer of about 40 nm thickness.

The substrate thus coated with the hole-extracting layer was spin-coated in a nitrogen atmosphere with each above coating solution at 600 rpm, to form an active layer of about 90 nm thickness. Subsequently, an electron-extracting layer of lithium fluoride having 0.1 nm average thickness and an electrode of aluminum having 100 nm thickness were successively formed by resistance heating vacuum deposition method. Thus, 1 cm-square solar cell devices S1 to S15 and SC1 to SC3 were produced.

Production of Solar Cell Devices S16 and S21

A glass substrate provided with a patterned indium-tin oxide (ITO) transparent electroconductive membrane was subjected to ultrasonic cleaning with a surfactant, washing with ultrapure water, and ultrasonic cleaning with ultrapure water in order, and then dried with nitrogen blow. The substrate was heated for 5 minutes at 120° C. in air to dry, and finally subjected to UV-ozone cleaning. The substrate was then spin-coated with an aqueous dispersion of poly(3,4-ethylenedioxy-thiophene)poly(styrenesulfonic acid) (PH500 [trademark], manufactured by Heraeus GmbH), and heated on a hot plate for 5 minutes at 140° C. in air to form a hole-extracting layer of about 40 nm thickness.

The substrate thus coated with the hole-extracting layer was spin-coated in a nitrogen atmosphere with a coating solution of P7, P8, P12, P13, P14 or P15 at 600 rpm, to form an active layer of about 90 nm thickness. For the purpose of photo-crosslinking, the substrate was exposed to UV light (254 nm, 1.9 mW/cm$^2$) for 30 minutes in an argon atmosphere.

Subsequently, an electron-extracting layer of lithium fluoride having 0.1 nm average thickness and an electrode of aluminum having 100 nm thickness were successively formed by resistance heating vacuum deposition method. Thus, 1 cm-square solar cell devices S16 to S21, which had crosslinked active layers, were produced.

Evaluation of Solar Cell Device on Conversion Efficiency

Each of the above-prepared solar cell devices was covered with a 1-cm square metal mask, and the current-voltage characteristic between the ITO electrode and the aluminum electrode was measured by use of a solar simulator (air mass (AM): 1.5 G, irradiation illuminance: 100 mW/cm$^2$; SPECTR solar simulator IVP0605 [trademark], manufactured by Asahi Spectra Co., Ltd.). The results are shown in Table 1.

TABLE 1

Power generation efficiencies of organic thin-film solar cell devices 1 cm$^2$ cell: Cell constitution: glass/ITO/PDOT: PSS(PH500)/Polymer: PC70BM/LiF/Al

| Solar cell | Polymer | Conversion efficiency |
| --- | --- | --- |
| S-1 | P1 | 7.22 |
| S-2 | P2 | 6.68 |
| S-3 | P3 | 7.18 |
| S-4 | P4 | 7.02 |
| S-5 | P5 | 7.15 |
| S-6 | P6 | 7.02 |
| S-7 | P7 | 4.9 |
| S-8 | P8 | 4.6 |
| S-9 | P9 | 6.95 |
| S-10 | P10 | 7.11 |
| S-11 | P11 | 7.23 |
| S-12 | P12 | 4.6 |
| S-13 | P13 | 5.1 |
| S-14 | P14 | 4.9 |
| S-15 | P15 | 5.6 |
| S-16 | P7 | 4.8 |
| S-17 | P8 | 4.6 |
| S-18 | P12 | 4.4 |
| S-19 | P13 | 4.9 |
| S-20 | P14 | 4.8 |
| S-21 | P15 | 5.3 |
| SC-1 | PTB7 | 6.65 |
| SC-2 | PBDTTT-CT | 4.52 |
| SC-3 | PBDTTT-CF | 5.08 |

Evaluation of Solar Cell Device on Light Resistance

Each of the above-prepared solar cell devices was covered with a 1-cm square metal mask, and the light resistance was tested according to C8938 of JIS regulations. The light source having an air mass (AM) of 1.5 G and an irradiation illuminance of 100 mW/cm² was so adjusted that the black panel temperature might be 63° C., and then each device was exposed to light from the source continuously for 80 hours. Thereafter, the current-voltage characteristic between the ITO electrode and the aluminum electrode was measured in the manner described above. The results are shown in Table 2.

TABLE 2

Light resistances of organic thin-film solar cell devices

| Solar cell | Polymer | Decay rate (%) of conversion efficiency after exposure for 80 hours |
|---|---|---|
| S-1 | P1 | 47 |
| S-2 | P2 | 48 |
| S-3 | P3 | 45 |
| S-4 | P4 | 42 |
| S-5 | P5 | 46 |
| S-6 | P6 | 41 |
| S-7 | P7 | 49 |
| S-8 | P8 | 47 |
| S-9 | P9 | 48 |
| S-10 | P10 | 45 |
| S-11 | P11 | 46 |
| S-12 | P12 | 47 |
| S-13 | P13 | 43 |
| S-14 | P14 | 46 |
| S-15 | P15 | 42 |
| S-16 | P7 | 16 |
| S-17 | P8 | 19 |
| S-18 | P12 | 14 |
| S-19 | P13 | 12 |
| S-20 | P14 | 14 |
| S-21 | P15 | 11 |
| SC-1 | PTB7 | 61 |
| SC-2 | PBDTTT-CT | 63 |
| SC-3 | PBDTTT-CF | 61 |

The results in Table 1 indicate that the synthesized polymers gave power-generation efficiencies almost equal to or greater than the comparative three polymers. The solar cell devices comprising the polymers P7 and P8 are found to show slightly poor efficiencies (whether or not the polymers were crosslinked by light).

However, the results in Table 2 for light resistance indicate that the polymers according to the present embodiment gave decay rates of less than 50% while those of three Comparative examples gave rates of about 60%. Accordingly, the polymers of the present embodiment are found to improve the light resistance remarkably.

Specifically, the polymers P7, P8, P12, P13, P14 and P15, which were crosslinked by light, gave particularly small decay rates, namely, less than 20%, and hence were found to further improve the light resistance.

In this way, the solar cell devices according to embodiments of the present disclosure were confirmed to have both high power generation efficiencies and excellent light resistances.

DESCRIPTION OF THE NUMERALS

100: solar cell device
110: substrate
120, 160: electrode
130, 150: buffer layer
140: active layer
200: electronic tag
201: displaying screen
202: solar cell
300: e-book reader
301: displaying screen
302: solar cell
400: sensor
401: solar cell
402: displaying screen
403: sensing element

The invention claimed is:
1. A polymer comprising:
(i) a repeating unit represented by formula (M1):

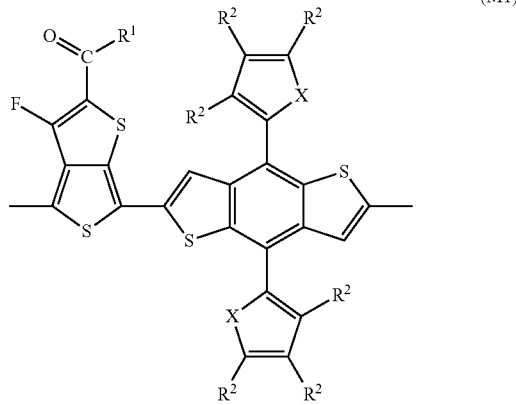

and
(ii) a repeating unit represented by formula (M3):

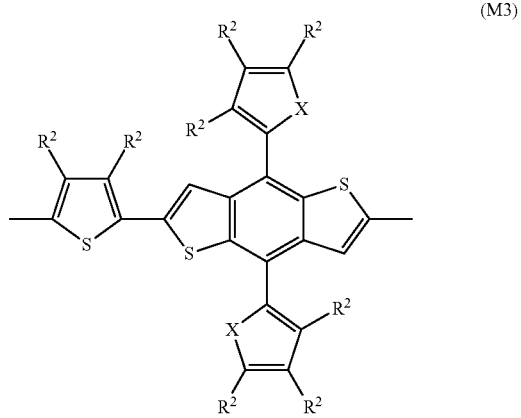

wherein, in formulae (M1) and (M3):
  $R^1$ is a substituent group selected from the group consisting of unsubstituted alkyl groups, substituted alkyl groups, unsubstituted alkoxy groups, substituted alkoxy groups, unsubstituted aryl groups, and substituted aryl groups;

each $R^2$ is independently a substituent group selected from the group consisting of hydrogen, halogen, unsubstituted alkyl groups, substituted alkyl groups, unsubstituted alkoxy groups, substituted alkoxy groups, unsubstituted aryl groups, and substituted aryl groups; and each X is independently an atom selected from the group consisting of O, S and Se, wherein said polymer has a weight average molecular weight of 3000 to 1000000.

2. The polymer according to claim 1, wherein every X is O.

3. The polymer according to claim 1, wherein said $R^1$ is a substituent group selected from the group consisting of unsubstituted alkyl groups, substituted alkyl groups, unsubstituted aryl groups, and substituted aryl groups.

4. The polymer according to claim 1, which comprises the repeating unit represented by the formula (M1) in an amount of 50 mol % or more based on the total molar amount of all the repeating units.

5. The polymer according to claim 1, which further comprises a repeating unit represented by formula (M2):

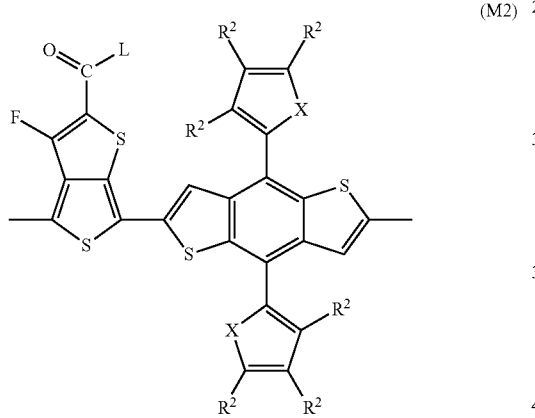

(M2)

wherein:
L is a crosslinkable group; and
$R^2$ and X are as defined for formulae (M1) and (M3).

6. The polymer according to claim 5, which comprises the repeating units represented by the formulas (M2) and (M3) in an amount of 0.1 to 50 mol % in total based on the total molar amount of all the repeating units.

7. The polymer according to claim 1, wherein at least one of said $R^2$s is a crosslinkable group.

8. The polymer according to claim 1, wherein each terminal group is independently an aryl group having an electron-withdrawing group or an aryl group having an electron-donating group.

9. The polymer according to claim 1, wherein either terminal group is a crosslinkable group.

10. A solar cell comprising the polymer according to claim 1.

11. A bulk hetero-junction type organic thin-film solar cell comprising an active layer in which the polymer according to claim 1 and a fullerene derivative are contained as an electron donor and an electron acceptor, respectively.

12. An electronic product comprising the solar cell according to claim 10 as a power supply device.

13. A polymer comprising a repeating unit represented by formula (m1):

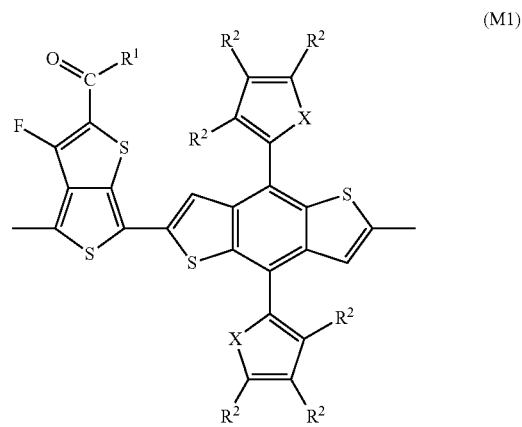

(M1)

wherein:
$R^1$ is a substituent group selected from the group consisting of unsubstituted alkyl groups, substituted alkyl groups, unsubstituted alkoxy groups, substituted alkoxy groups, unsubstituted aryl groups, and substituted aryl groups;

each $R^2$ is independently a substituent group selected from the group consisting of hydrogen, halogen, unsubstituted alkyl groups, substituted alkyl groups, unsubstituted alkoxy groups, substituted alkoxy groups, unsubstituted aryl groups, and substituted aryl groups; and every X is O, wherein said polymer has a weight average molecular weight of 3000 to 1000000.

14. A solar cell comprising the polymer according to claim 13.

15. A bulk hetero junction type organic thin-film solar cell comprising an active layer in which the polymer according to claim 13 and a fullerene derivative are contained as an electron donor and an electron acceptor, respectively.

16. An electronic product comprising the solar cell according to claim 14 as a power supply device.

* * * * *